(12) United States Patent
Tsuboi et al.

(10) Patent No.: US 6,921,693 B2
(45) Date of Patent: Jul. 26, 2005

(54) SEMICONDUCTOR DEVICE AND PROCESS FOR FABRICATING THE SAME

(75) Inventors: Osamu Tsuboi, Kawasaki (JP); Tomohiko Tsutsumi, Kawasaki (JP); Kazutaka Yoshizawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 26 days.

(21) Appl. No.: 10/179,200

(22) Filed: Jun. 26, 2002

(65) Prior Publication Data

US 2002/0167039 A1 Nov. 14, 2002

Related U.S. Application Data

(62) Division of application No. 09/488,010, filed on Jan. 20, 2000, now Pat. No. 6,459,112.

(30) Foreign Application Priority Data

Jan. 22, 1999 (JP) .............................................. 11-14555
Oct. 28, 1999 (JP) .......................................... 11-306484

(51) Int. Cl.[7] ............................................ H01L 21/20
(52) U.S. Cl. ...................... 438/254; 438/397; 438/739
(58) Field of Search ................................ 438/239, 253, 438/396, FOR 430, 233, 348, 523, 533, 618, 621, 622, 624, 625, 626, 629, 631, 632, 634, 639, 637, FOR 196, 254, 397, 739

(56) References Cited

U.S. PATENT DOCUMENTS 5,194,404 A * 3/1993 Nagatomo ................... 438/655
5,279,989 A * 1/1994 Kim ............................ 438/396
5,436,188 A * 7/1995 Chen .......................... 438/397
5,453,633 A   9/1995 Yun ............................ 257/306
5,808,365 A * 9/1998 Mori .......................... 257/775
6,028,360 A * 2/2000 Nakamura et al. .......... 257/758
6,107,172 A * 8/2000 Yang et al. ................. 438/585
6,140,201 A * 10/2000 Jenq et al. .................. 438/396
6,255,151 B1 * 7/2001 Fukuda et al. .............. 438/197

FOREIGN PATENT DOCUMENTS

JP        09-055481         2/1997
JP        2725652           12/1997
WO        WO 9736327 A1 *   10/1997    ......... H01L/27/108

* cited by examiner

Primary Examiner—Paul E Brock, II
(74) Attorney, Agent, or Firm—Westerman, Hattori, Daniels & Adrian, LLP

(57) ABSTRACT

A semiconductor device comprising: a first insulation film 60 formed above a base substrate 10; a second insulation film 61 formed on the first insulation film and having different etching characteristics from the first insulation film; and a capacitor 79 including a storage electrode 68 formed on the second insulation film, projected therefrom, the storage electrode being formed, extended downward from side surfaces of the second insulation film. The lower ends of the storage electrodes are formed partially below the etching stopper film, whereby the storage electrodes are fixed by the etching stopper film. Accordingly, the storage electrodes are prevented from peeling off in processing, such as wet etching, etc. The semiconductor device can be fabricated at high yields.

13 Claims, 17 Drawing Sheets

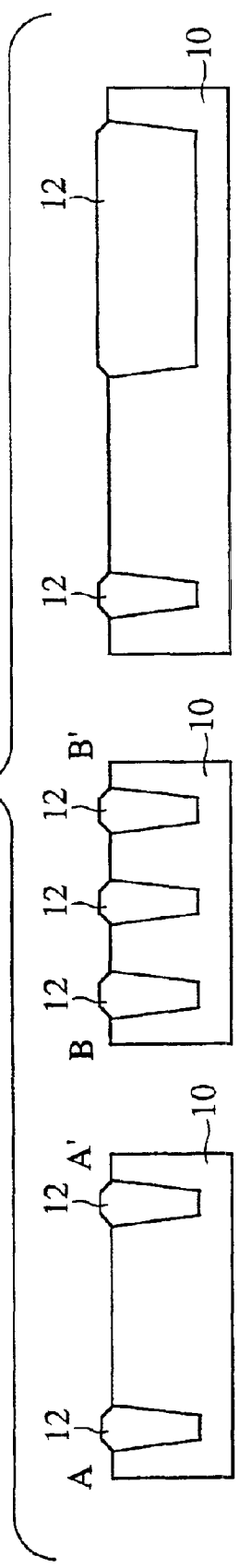
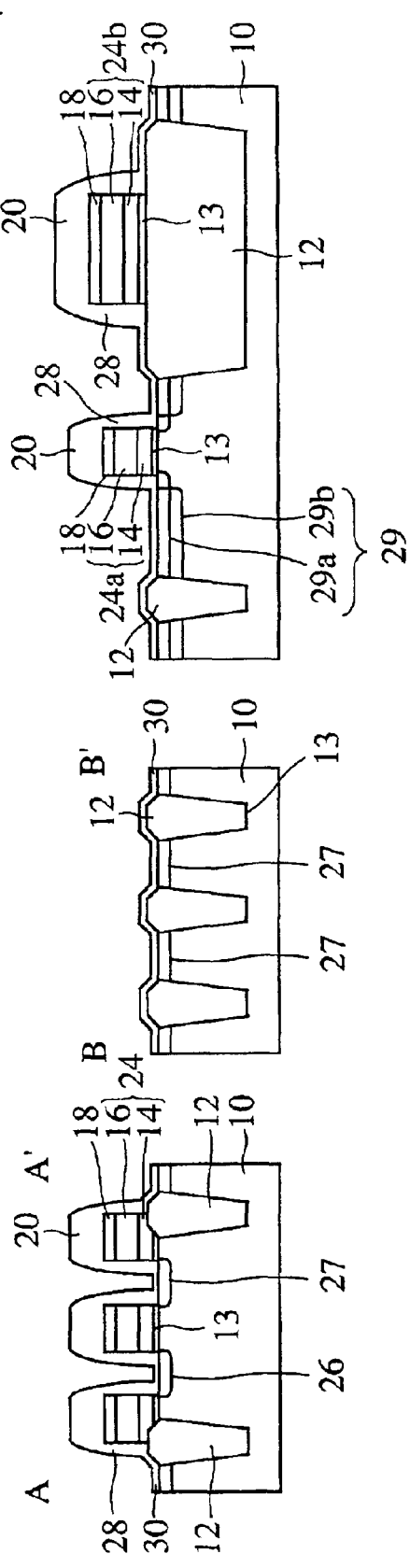

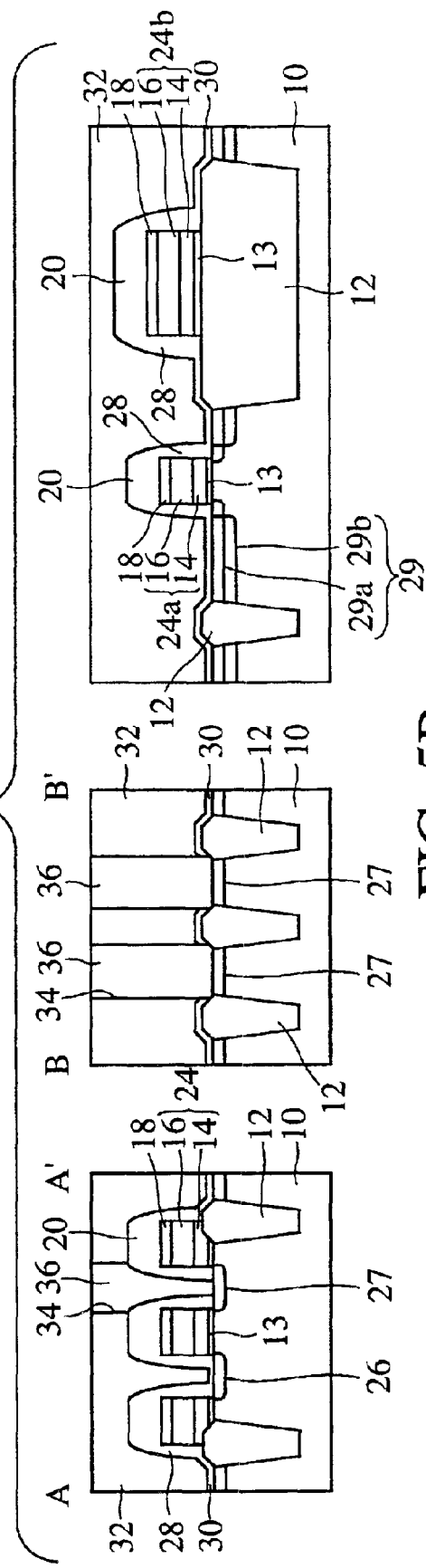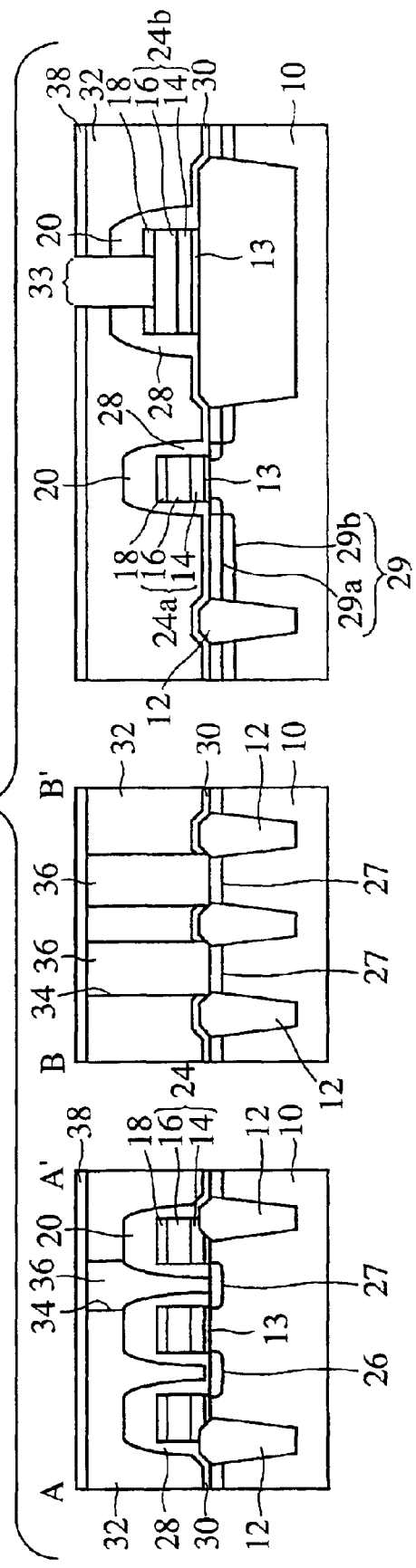

US 6,921,693 B2

1

SEMICONDUCTOR DEVICE AND PROCESS FOR FABRICATING THE SAME

This application is a division of prior application Ser. No. 09/448,010, filed Jan. 20, 2000, now U.S. Pat. No. 6,459,112.

BACKGROUND OF THE INVENTION

The present invention relates to a semiconductor device and a process for fabricating the same, more specifically to a semiconductor device including capacitors and a process for fabricating the same.

A dynamic random access memory (DRAM) comprises memory cells each including one transfer transistor and one capacitor, which allows the DRAM to have a small area. This makes the DRAM a semiconductor device suitable for larger capacities. Because of the recent increased amounts of information processing of electronic devices, etc., DRAMS to be used in the electronic devices, etc. are required to be further micronized and have larger capacities. A DRAM having the cylindrical capacitors which will be described below are used.

A process for fabricating the conventional DRAM will be explained with reference to FIGS. 15A to 17. In FIGS. 15A to 17, the views on the left sides of the drawings are sectional views of the DRAM along a bit line, and sectional views of the DRAM along a word line are shown on the right sides of the drawings.

A device isolation film 112 is formed on the surface of a silicon substrate 110 by LOCOS (LOCal Oxidation of Silicon). Then, a gate oxide film (not shown) is formed on the surface of the silicon substrate 110. Next, a polysilicon film 114, a tungsten silicide film 116, a silicon oxide film 118, a silicon nitride film 120 and a silicon nitride oxide film 122 are sequentially formed on the entire surface by CVD (Chemical Vapor Deposition) to form a layer film 123 of these films.

Then, the layer film 123 is patterned into a prescribed shape to form gate electrodes 124 of the polycide structure of the polysilicon film 114 and the tungsten silicide film 116. The gate electrodes 124 function as the word lines also functioning as the gate electrodes of other transfer transistors extended vertically as viewed in the drawing on the left side of FIG. 15A.

Dopant ions are implanted in the silicon substrate 110 with the layer film 123 as a mask to form a source/drain diffused layer 126a, 126b by self-alignment with the layer film 123. Next, a silicon nitride film is formed on the entire surface and is subjected to anisotropic etching until the surfaces of the silicon substrate 110, the device isolation film 112 and the layer film 123 to form a sidewall insulation film 128 on the sidewalls of the layer film. The sidewall insulation film 128 is for forming an SAC (Self Aligned Contact) for ensuring a large margin for shift of the micronized contact. Then, an etching stopper film 130 of the silicon nitride film is formed on the entire surface.

Then, an inter-layer insulation film 132 of an about 0.5 μm-thickness BPSG (Boro-Phospho-Silicate Glass) film is formed by CVD. Then, the surface of the inter-layer insulation film 132 is planarized by reflow and CMP (Chemical Mechanical Polishing). Next, contact holes 134 for exposing the source/drain diffused layer 126b are formed by self-alignment with the sidewall insulation film 128. Then, conductor plugs 136a are formed in the contact holes 134 (see FIG. 5A).

Next, an about 0.1 μm-thickness silicon oxide film 138 is formed on the entire surf ace by CVD. Next, contact holes

2

140 for exposing the source/drain diffused layer 126a are formed by self-alignment with the sidewall insulation film 128. Then, a polysilicon film 142, a tungsten silicide film 144, a silicon oxide film 146, a silicon nitride film 148 and a silicon nitride oxide film 150 are sequentially formed by CVD on the entire surface to form a layer film 152 of these films. Then, the layer film 152 is patterned into a prescribed shape to form bit lines 154 of the polycide structure of the polysilicon film 142 and the tungsten silicide film 144 (FIG. 15B).

Next, a silicon nitride film is formed on the entire surface and is subjected to anisotropic etching until the surfaces of the silicon oxide film 138 and the layer film 152 are exposed, whereby a sidewall insulation film 156 is formed on the sidewalls of the layer film 152. Next, an inter-layer insulation film 160 is formed on the entire surface. Then, the surface of the inter-layer insulation film 160 is planarized by CMP. Then, an etching stopper film 161 of silicon nitride film is formed on the inter-layer insulation film 160 by CVD. Then, contact holes 162 for exposing the upper surfaces of the conductor plugs 136a are formed. Next, conductor plugs 136b are formed in the contact holes 162 (see FIG. 16A).

Next, an about 1.7 μm-thickness BPSG film 164 is formed on the entire surface by CVD. Then, openings 166 for exposing the upper surfaces of the conductor plugs 136b are formed in the BPSG film 164. The openings 166 are for forming storage electrodes 168 (see FIG. 17) of capacitors 179 in a later step (FIG. 16B).

Next, an about 0.05 μm-thickness polysilicon film is formed on the entire surface by CVD. Next, a resist film not shown is applied to the entire surface. Then, the polysilicon film and the resist film are polished by CMP until the surface of the BPSG film 164 is exposed. The storage electrodes 168 of the polysilicon film are formed inside the openings 166. Next, the BPSG film 164 is removed by HF-based wet etching with the etching stopper film 161 as a stopper.

Then, the resist film left on the inside of the storage electrodes 168 is removed by ashing. Next, an about 8 nm-thickness tantalum oxide film 172 is formed on the entire surface by CVD. The tantalum oxide film 172 functions as a dielectric of the capacitors 179. Next, a 0.05 μm-thickness titanium nitride film 174 and a 0.1 μm-thickness polysilicon film 176 are sequentially formed by CVD to form an opposed electrode 177 of the capacitors (see FIG. 17).

However, in the conventional DRAM fabrication process, when the BPSG film 164 is HF-based wet etching, it is often a case that the storage electrodes 168 are adversely peeled off the conductor plug 136b, or the etchant permeates near the upper surfaces of the conductor plugs 136b to adversely etch regions which should not be etched. This lowers yields of the DRAM.

In micronizing the DRAM it is necessary to increase a height of the capacitors so as to maintain substantially the same capacity of the capacitors. As a result, steps between each cell and its adjacent one is larger, which makes the formation of the contact holes and wirings difficult.

In the process for fabricating the conventional DRAM, a space must be ensured for the contacts between the gate electrodes of the transistors of peripheral circuits and the upper wirings, which hinders further micronization of the DRAM.

In the process for fabricating the conventional DRAM, the bit lines 154 are covered with a thick silicon nitride film of the high dielectric constant, which results in large parasitic capacities.

SUMMARY OF THE INVENTION

A first object of the present invention is to provide a semiconductor device and a process for fabricating the semiconductor device which can fabricate at high yields the semiconductor device even including cylindrical capacitors. A second object of the present invention is to provide a semiconductor device and a process for fabricating the semiconductor device which can realize space-savings for peripheral circuits. A third object of the present invention is to provide a semiconductor device and a process for fabricating the semiconductor device which can fabricate the semiconductor device having small parasitic capacities between the bit lines and the conductor plugs.

The above-described objects are achieved by a semiconductor device comprising: a first insulation film formed above a base substrate; a second insulation film formed on the first insulation film and having different etching characteristics from the first insulation film; and a capacitor including a storage electrode formed on the second insulation film, projected therefrom, the storage electrode being formed, extended downward from side surfaces of the second insulation film. The storage electrode can be securely fixed to the base, whereby the semiconductor device can be fabricated at high yields.

In the above-described semiconductor device it is preferable that the storage electrode is electrically connected to the base substrate through a conductor plug buried in the first insulation film.

The above-described objects are achieved by a semiconductor device comprising: a first insulation film formed above a base substrate; a second insulation film formed on the first insulation film and having different etching characteristics from the first insulation film; and a capacitor including a storage electrode formed on the second insulation film, projected therefrom, the storage electrode functioning as a conductor plug electrically connected to the base substrate.

In the above-described semiconductor device it is preferable that the storage electrode further includes a sidewall film on a side wall of an opening formed through the second insulation film, the sidewall film being formed of a material having different etching characteristics from the first insulation film. The storage electrode can be securely fixed to the base.

In the above-described semiconductor device it is preferable that the sidewall film is formed, extended downward from side surfaces of the second insulation film. The sidewalls film can be securely fixed to the base, which leads to secured fixation of the storage electrode to the base.

In the above-described semiconductor device it is preferable that the capacitor is in the shape of a cylinder which is projected from the second insulation film. The capacitors can have a large capacitance.

In the above-described semiconductor device it is preferable that the storage electrode is formed of a porous conductor film. The capacitors can have a large capacitance.

In the above-described semiconductor device it is preferable that the semiconductor device further comprising a wiring layer formed above the base substrate, wherein the insulation film between the wiring layer and the conductor plug is formed of a film having substantially uniform etching characteristics, and the conductor plug has a below 0.2 $\mu$m-diameter. The first wiring layer and the conductor plugs can have small parasitic capacitances because the first wiring layer is micronized, and the sidewall insulation film is absent on the side surfaces of the first wiring layer.

In the above-described semiconductor device it is preferable that the semiconductor device further comprising a wiring layer formed above the base substrate, wherein the insulation film between the wiring layer and the conductor plug is formed of a film having substantially uniform etching characteristics, and the wiring layer has a below 0.2 $\mu$m-width. The first wiring layer and the conductor plugs can have small parasitic capacitances because the first wiring layer is micronized, and the sidewall insulation film is absent on the side surfaces of the first wiring layer.

In the above-described semiconductor device it is preferable that the semiconductor device further comprising: a wiring layer formed above the base substrate; and a third insulation film formed on at least side surfaces of the wiring layer and having different etching characteristics from the first insulation film, wherein the first insulation film is formed also between the third insulation film and the conductor plug, and the conductor plug has a below 0.2 $\mu$m-diameter. Voltage resistance between the wiring layer and the conductor plug can be ensured, whereby the semiconductor device can have higher reliability.

In the above-described semiconductor device it is preferable that the semiconductor device further comprising: a wiring layer formed above the base substrate; and a third insulation film formed on at least side surfaces of the wiring layer and having different etching characteristics from the first insulation film, wherein the first insulation film is formed also between the third insulation film and the conductor plug, and the wiring layer has a below 0.2 $\mu$m-width. Voltage resistance between the wiring layer and the conductor plug can be ensured, whereby the semiconductor device can have higher reliability.

In the above-described semiconductor device it is preferable that the third insulation film is formed also on the upper surface of the wiring layer.

In the above-described semiconductor device it is preferable that the wiring layer is a bit line, and a width of the bit line is smaller than that of a word line. The bit lines are micronized, whereby the semiconductor device can have higher integration.

In the above-described semiconductor device it is preferable that the base substrate includes: a gate electrode of a transistor for a peripheral circuit, which is formed above a semiconductor substrate through a third insulation film; a fourth insulation film covering the upper surface and the side surfaces of the gate electrode; a fifth insulation film formed above the semiconductor substrate and the fourth insulation film, and having different etching characteristics from the fourth insulation film; a bit line formed on the fifth insulation film, and connected to a source/drain diffused layer of a transfer transistor through the fifth insulation film; and a wiring layer connected to the gate electrode through the fourth insulation film and the fifth insulation film, and formed of the same conductor layer as the bit line. The wiring layer can be directly connected to the gate electrodes of the transistors for peripheral circuits, whereby the semiconductor device can have higher integration.

The above-described objects are achieved by a process for fabricating a semiconductor device comprising the steps of: forming a first insulation film above a base substrate; forming on the first insulation film a second insulation film having different etching characteristics from the first insulation film; forming on the second insulation film a third insulation film having different etching characteristic from the second insulation film; forming a first opening which arrives at the first insulation film through the third insulation film and the second insulation film and arriving at a bottom of the second insulation film; forming a storage electrode on the inside wall of the first opening, the storage electrode being electrically connected to the base substrate; and etching the third insulation film with the second insulation film as an etching stopper. The storage electrode which reaches the bottom of the second insulation film can be formed, whereby the storage electrode can be securely fixed to the base. The semiconductor device can be fabricated at high yields.

In the above-described process for fabricating a semiconductor device it is preferable that in the step of forming the first insulation film, a conductor plug is formed, buried in the first insulation film, and in the step of forming the storage electrode, the storage electrode is formed, electrically connected to the base substrate through the conductor plug.

The above-described objects are achieved by a process for fabricating a semiconductor device comprising the steps of: forming a first insulation film above a base substrate; forming on the first insulation film a second insulation film having different etching characteristics from the first insulation film; forming in the second insulation film a first opening which arrives at the first insulation film; forming on the first insulation film and the second insulation film a third insulation film having different etching characteristics from the second insulation film; selectively etching the third insulation film and the first insulation film in a region containing the region where the first opening formed, with the second insulation film as an etching stopper to form a second opening in the third insulation film and to form a contact hole in the first insulation film; forming on inside walls of the second opening and in the contact hole a storage electrode electrically connected to the base substrate; and etching the third insulation film with the second insulation film as an etching stopper. The storage electrode is formed integral with the conductor plug, whereby the storage electrode is securely fixed to the base. The semiconductor device can be fabricated at high yields.

In the above-described process for fabricating a semiconductor device it is preferable that in the step of forming the first opening, the first opening is formed, arriving at a bottom of the second insulation film, the process for fabricating the semiconductor device further comprises, after the step of opening the first opening, a step of forming on inside walls of the first opening a sidewall film having different etching characteristics from the first insulation film, and in the step of forming the second opening and the contact hole, the third insulation film and the first insulation film are etched with the second insulation film and the sidewall film as an etching stopper. The conductor plugs can. be micronized, whereby the semiconductor device can have higher integration.

In the above-described process for fabricating a semiconductor device it is preferable that in the step of forming the storage electrode, the storage electrode is formed of a porous conductor film. The etchant permeates the third insulation film through pores of the porous conductor film to thereby quickly etch the third insulation film around the storage electrodes. Accordingly, the third insulation film in the region except the cell portions can be left, and a step between the cell portions and the region except the cell portion can be small.

The above-described objects are achieved by a process for fabricating a semiconductor device comprising the steps of: forming a first insulation film above a base substrate; forming in the first insulation film a second insulation film having different etching characteristics from the first insulation film; forming on the second insulation film a first opening arriving at the first insulation film; forming on inside wall of the first opening a sidewall film having different etching characteristics from the first insulation film; etching the first insulation film with the second isolation film and the sidewall film as a mask to form a contact hole in the first insulation film; and forming a conductor plug in the contact hole. The conductor plugs can be formed, micronized. The semiconductor device can be fabricated at high yields.

In the above-described process for fabricating a semiconductor device it is preferable that further comprising, before the step of forming the first insulation film, the steps of: forming a first conductor film above the base substrate; forming on the first conductor film a photo-mask having a wiring pattern of a first width; etching the photo-mask to reducing the first width of the photo-mask to a second width which is smaller than the first width, and etching the first conductor film by using the photo-mask to form a bit line of the second width formed of the first conductor film above the base substrate. The bit lines can be micronized, whereby the semiconductor device can have higher integration.

In the above-described process for fabricating a semiconductor device it is preferable that further comprising, after the step for forming the bit line and before the step of forming the first insulation film, a step of forming at least on side surfaces of the bit line a fourth insulation film having different etching characteristics from the first insulation film. Voltage resistance between the bit lines and the conductor plugs can be ensured. The semiconductor device can have high reliability.

In the above-described process for fabricating a semiconductor device it is preferable that in the step of forming the fourth insulation film, the fourth insulation film is formed also on an upper surface of the bit line.

In the above-described process for fabricating a semiconductor device it is preferable that further comprising, before the step of forming the first insulation film, the steps of: forming a first wiring layer and a second wiring layer through the fourth insulation film above a semiconductor substrate; forming a fifth insulation film on an upper surface and side surfaces of the first wiring film, and an upper surface and side surfaces of the second wiring layer; forming above the semiconductor substrate and the fifth insulation film a sixth insulation film having different etching characteristics from the fifth insulation film; forming in the fifth insulation film and the sixth insulation film a first contact hole arriving at the first wiring layer; and forming in the sixth insulation film a second contact hole arriving at the base substrate by self-alignment with the fifth insulation film covering the second wiring layer. The first wiring layer and the upper wiring can be directly connected to each other through the first contact holes, whereby the semiconductor device can have higher integration.

In the above-described process for fabricating a semiconductor device it is preferable that further comprising, the steps of: after the step of forming the second contact hole, forming a first conductor film in the first contact hole and the second contact hole and on the sixth insulation film; and performing a heat treatment at a temperature of above 900° C. The first conductor film and the first wiring layer can have good contact with each other.

BRIEF DESCRIPTION OF THE DRAWINGS

FIGS. 4A and 4B are sectional views of the semiconductor device according to the first embodiment of the present invention in the steps of the process for fabricating the same, which explain the process (Part 1).

FIGS. 5A and 5B are sectional views of the semiconductor device according to the first embodiment of the present invention in the steps of the process for fabricating the same, which explain the process (Part 2).

DETAILED DESCRIPTION OF THE INVENTION

[A First Embodiment]

Figure 1:
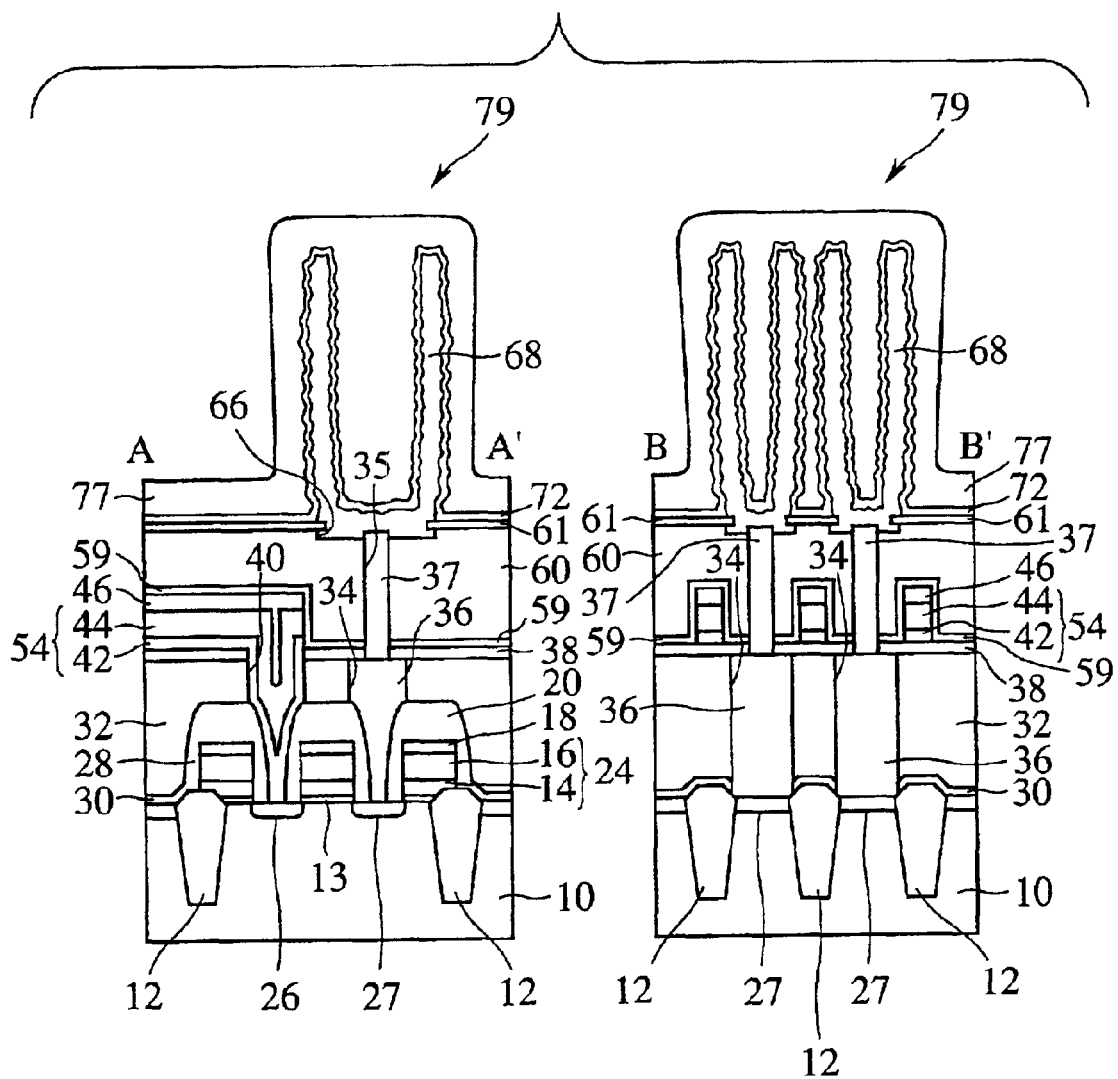
FIG. 1 is sectional views of the semiconductor device according to a first embodiment of the present invention.
Figure 2:
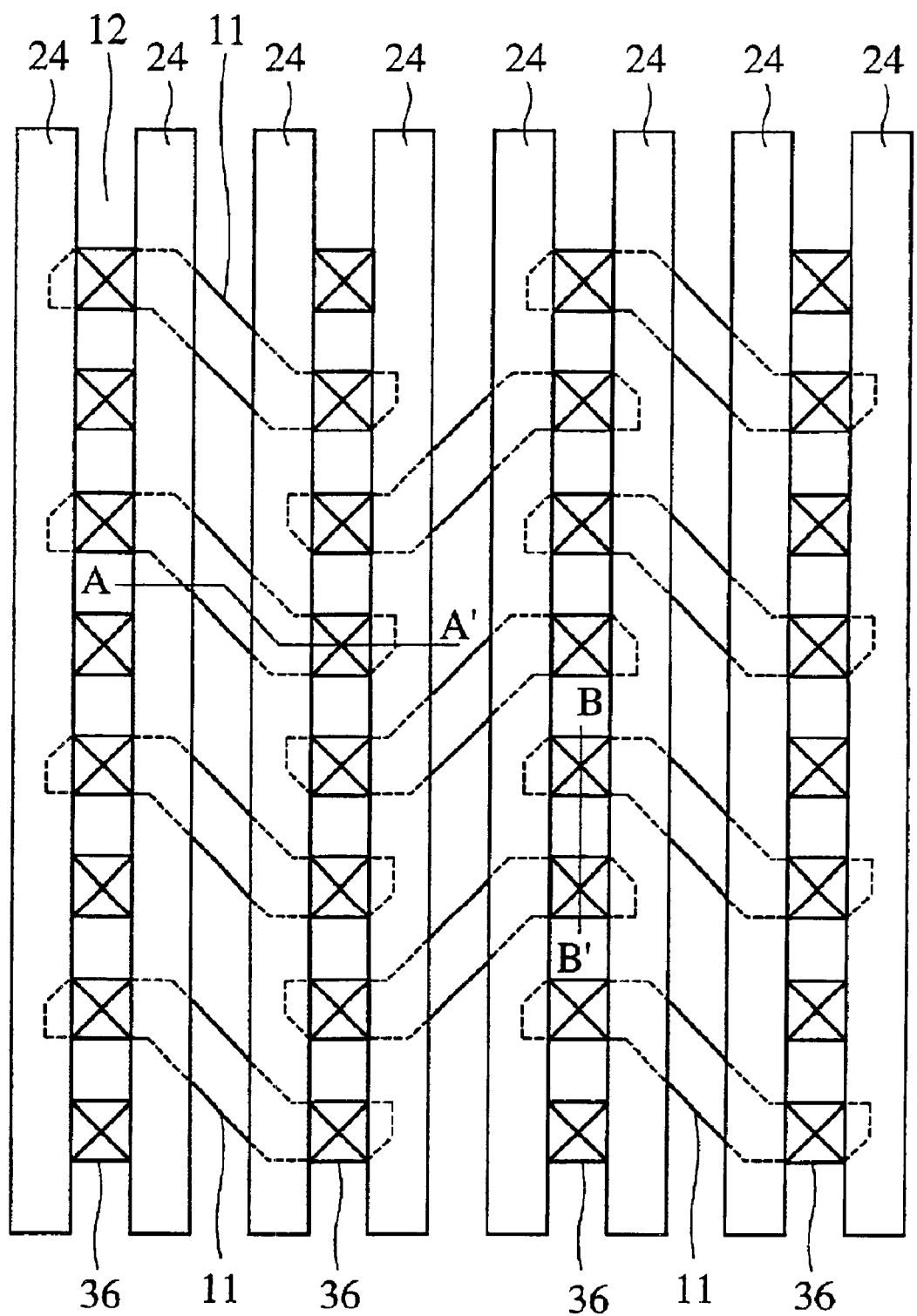
FIG. 2 is a plan view of the semiconductor device according to the first embodiment of the present invention.
Figure 3:
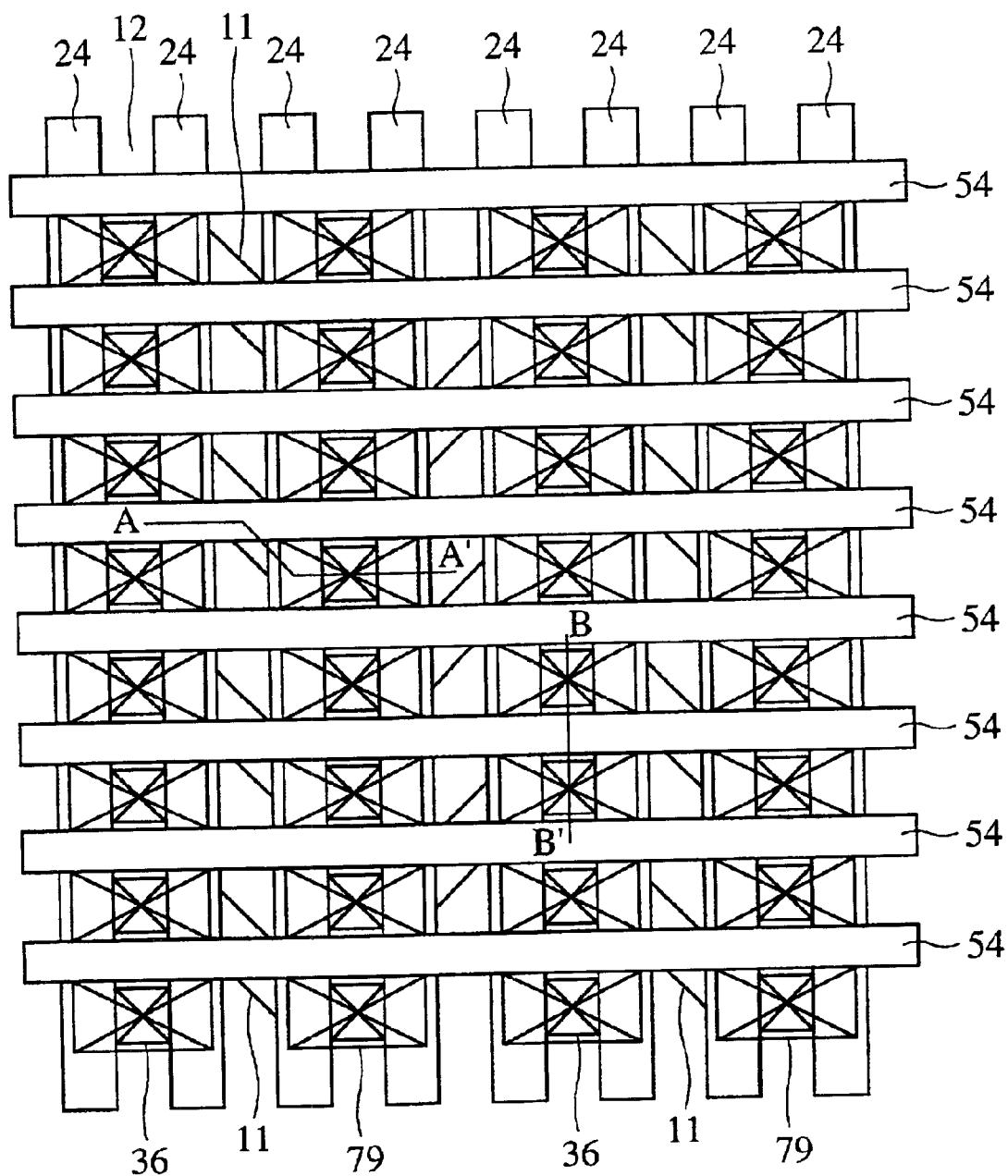
FIG. 3 is another plan view of the semiconductor device according to the first embodiment of the present invention.
Figure 6A:
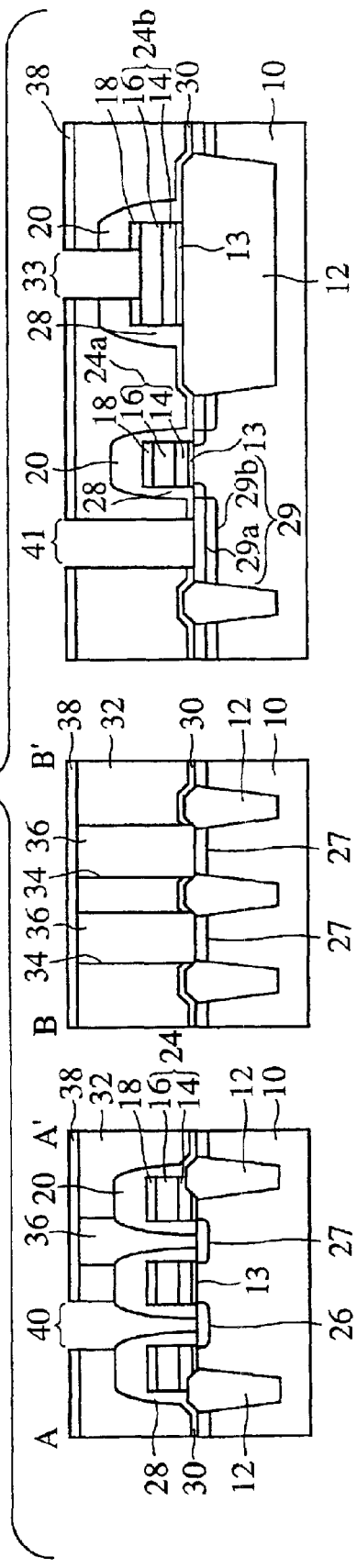
FIGS. 6A and 6B are sectional views of the semiconductor device according to the first embodiment of the present invention in the steps of the process for fabricating the same, which explain the process (Part 3).
Figure 6B:
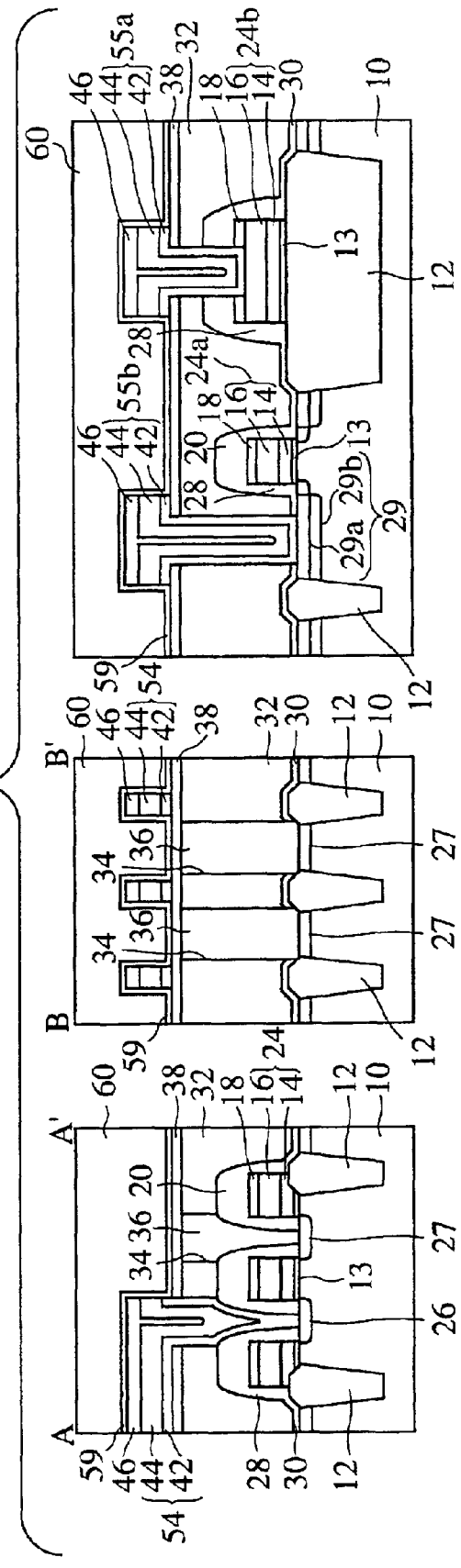
Figure 7A:
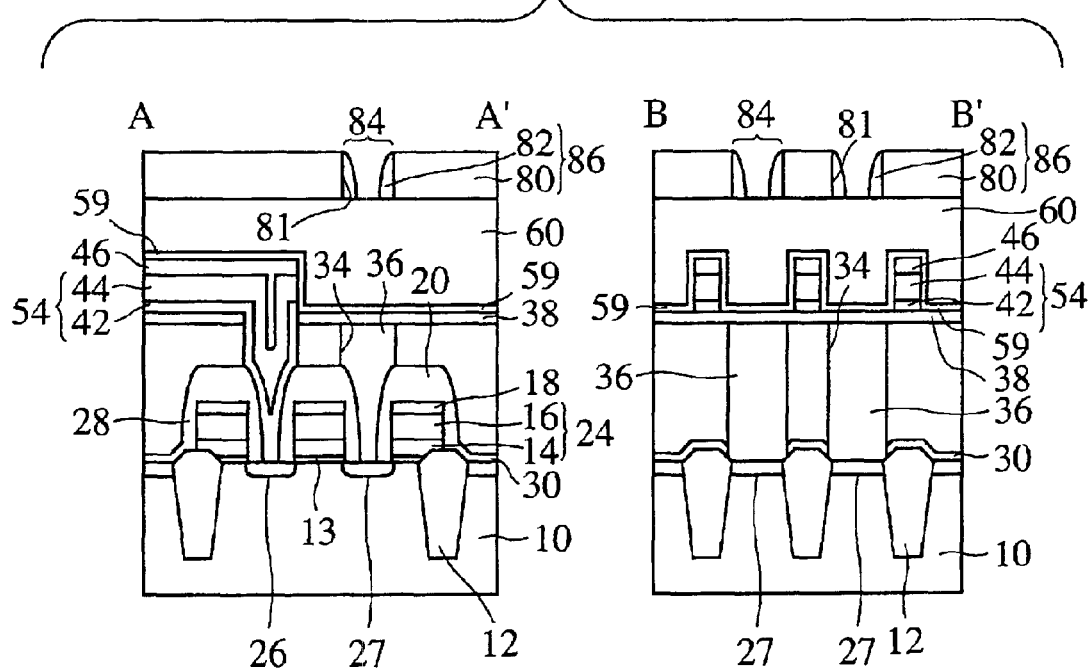
FIGS. 7A and 7B are sectional views of the semiconductor device according to the first embodiment of the present invention in the steps of the process for fabricating the same, which explain the process (Part 4).
Figure 7B:
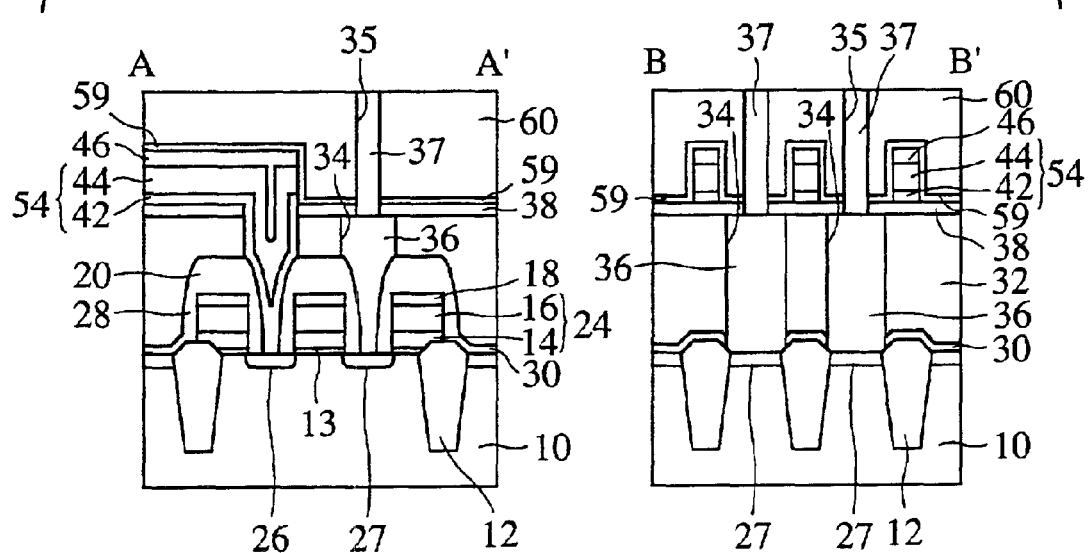
Figure 8A:
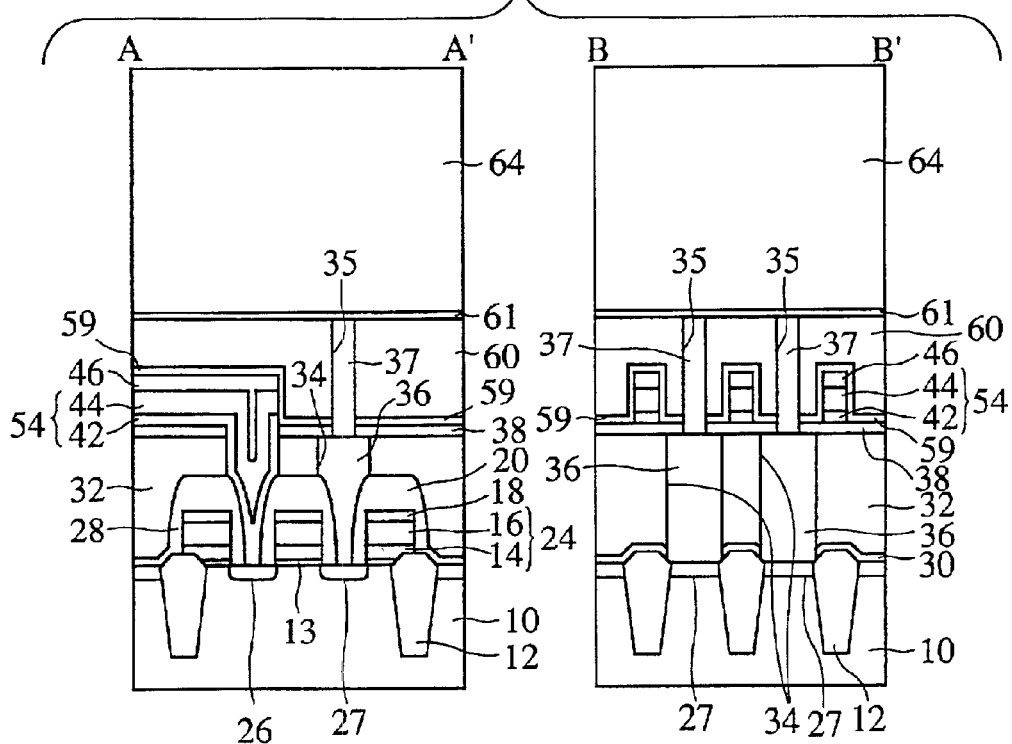
FIGS. 8A and 8B are sectional views of the semiconductor device according to the first embodiment of the present invention in the steps of the process for fabricating the same, which explain the process (Part 5).
Figure 8B:
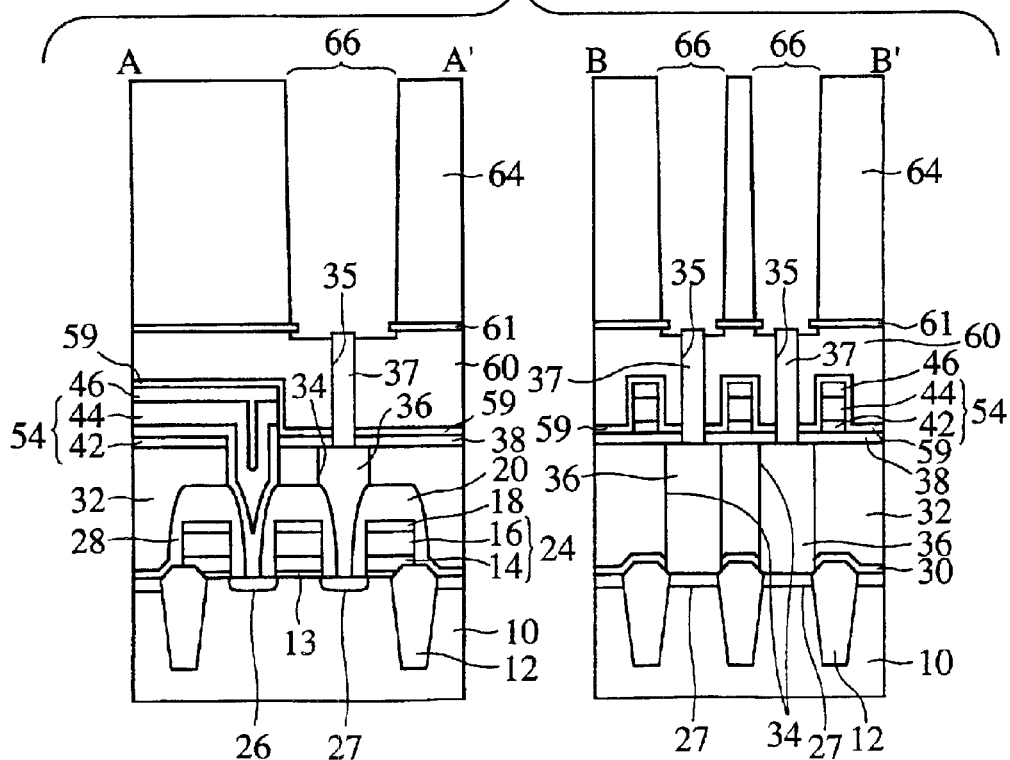
Figure 9A:
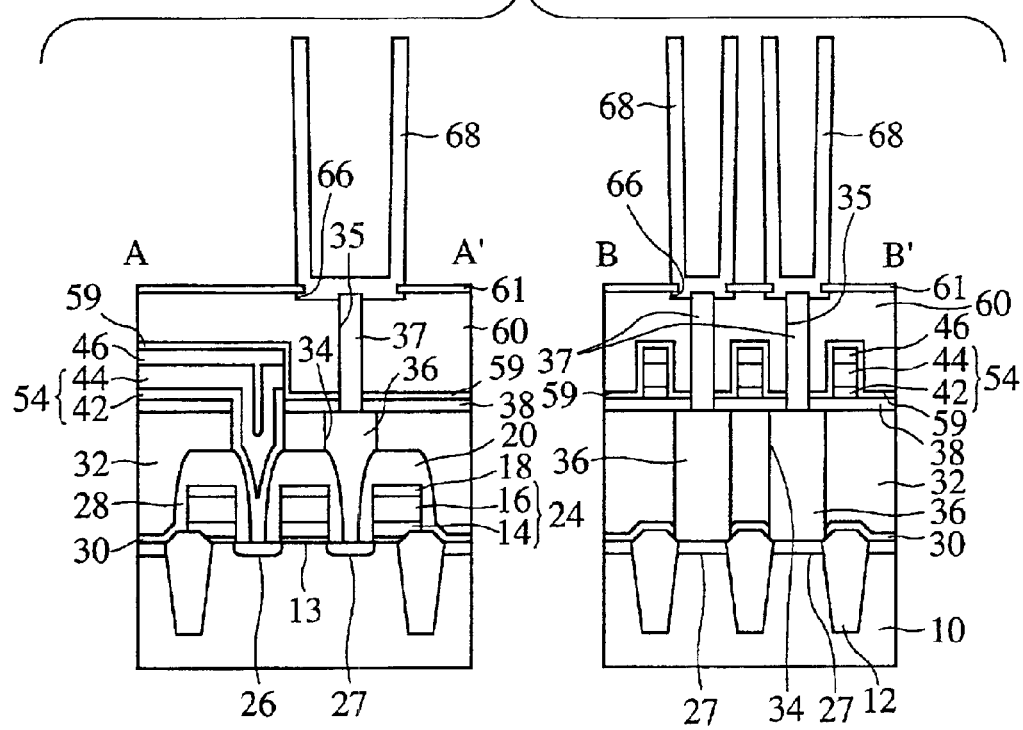
FIGS. 9A and 9B are sectional views of the semiconductor device according to the first embodiment of the present invention in the steps of the process for fabricating the same, which explain the process (Part 6).
Figure 9B:
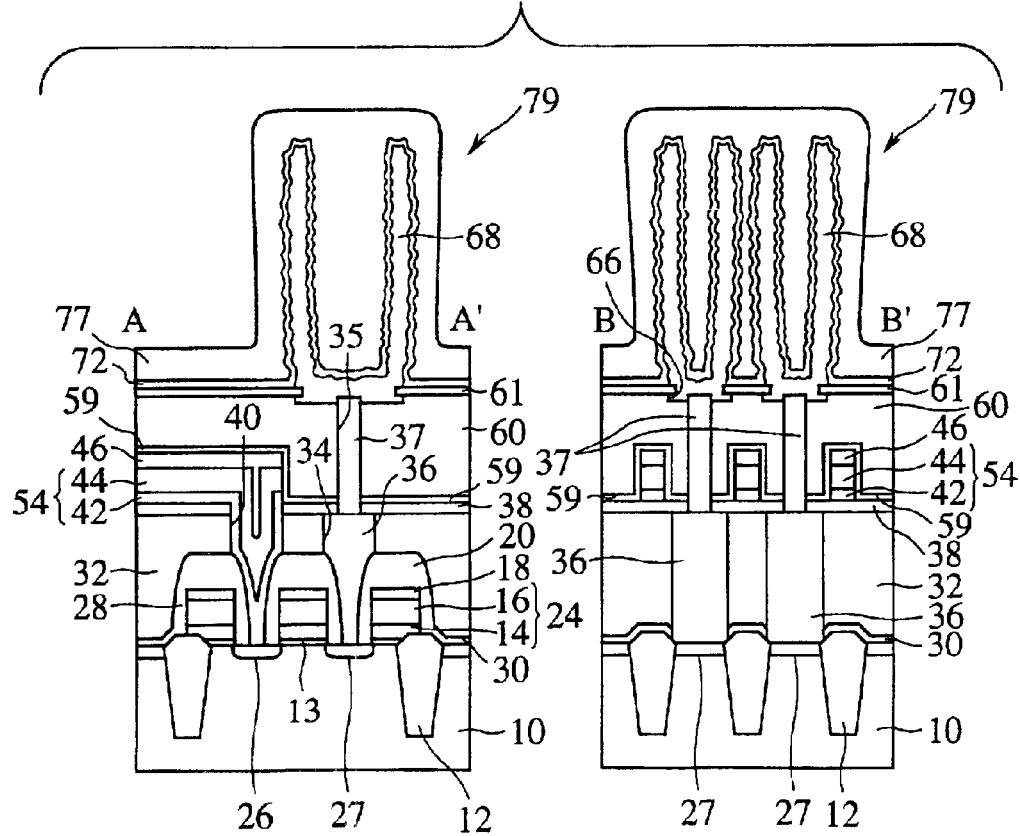

The semiconductor device according to a first embodiment of the present invention and the process for fabricating the semiconductor device will be explained with reference to FIGS. 1 to 9B. FIG. 1 is sectional views of the semiconductor device according to the present embodiment, which show a structure thereof. FIG. 2 is a plan view of the semiconductor device according to the present embodiment. FIG. 3 is another plan view of the semiconductor device according to the present embodiment. FIGS. 4A to 9B are sectional views of the semiconductor device according to the present embodiment in the steps of the process for fabricating the same, which explain the process. The semiconductor device according to the present embodiment is a DRAM. The view of FIG. 1 on the left side is a sectional view along the line A–A' in FIGS. 2 and 3, i.e., a sectional view along a bit line of the DRAM. The view of FIG. 1 on the right side is a sectional view along the line B–B' in FIGS. 2 and 3, i.e., a sectional view along a word line of the DRAM.

(The Semiconductor Device)

First, the semiconductor device according to the present embodiment will be explained with reference to FIGS. 1 to 3. As shown in FIGS. 1 and 2, a device isolation region 12 for defining device regions 11 are formed on the surface of a silicon substrate 10. In the device regions 11 there are formed transfer transistors including gate electrodes 24 which are extended vertically as viewed in the drawing on the left side of FIG. 1, and source/drain diffused layers 26, 27.

The gate electrodes 24 of the transfer transistors have a polycide structure of a 50 nm-thickness polysilicon film 14 and a 100 nm-thickness tungsten silicide film 16 formed on a gate insulation film 13. The gate electrodes 24 function as the word lines of the other transfer transistors, which act also as the gate electrodes thereof (see FIG. 2).

The gate electrodes 24 have a width of, e.g., 0.18 $\mu$m. A reflection preventive film 18 of a silicon nitride oxide film is formed on the gate electrodes 24. A silicon nitride film 20 is formed on the reflection preventive film 18. A sidewall insulation film 28 is formed on the side walls of the gate electrodes 24, the reflection preventive film 18 and the silicon nitride film 20. The source/drain diffused layer 26, 27 is formed of a lightly-doped diffused layer by self-alignment with the gate electrodes 24.

An etching stopper film 30 of a 20 nm-thickness silicon nitride film is formed on the entire surface of the silicon substrate 10 with the transfer transistors thus formed on. An inter-layer insulation film 32 of a 500 nm-thickness BPSG film is further formed on the entire surface.

In the inter-layer insulation film 32 there are formed one contact holes 34 of the transfer transistors, which reach the source/drain diffused layer 27, and conductor plugs 36 are buried in the contact holes 34.

A 60 nm-thickness silicon oxide film 38 is formed on the inter-layer insulation film 32 with the conductor plugs 36 buried in. On the silicon oxide film 38 there are formed bit lines 54 which are connected to the source/drain diffused layers 26 of the transfer transistors through the contact holes 40 and which are extended horizontally as viewed in the drawing on the left side of FIG. 1 (see FIG. 3). The bit lines 54 have a polycide structure of a 40 nm-thickness polysilicon film 42 and a 160 nm-thickness tungsten silicide film 44. A silicon nitride oxide film 46 is formed on the bit lines 54.

The structure of the bit lines 54 is not limited to the above-described one. The bit lines 54 may be formed of, e.g., a 40 nm-thickness titanium film a 20 nm-thickness titanium nitride film and a 100 nm-thickness tungsten film, and a 80 nm-thickness silicon nitride oxide film 46 may be formed on the bit lines 54. The W/TiN/Ti structure of the bit lines contains metal films, and the bit lines 54 can be low resistive.

The semiconductor device according to the present embodiment is characterized mainly in that a width of the bit lines 54 is so small as 120 nm. In the current photolithography, even with a KrF excimer laser, whose wavelength is very short, a minimum resolution limit dimension is about 160 nm. In contrast to this, the semiconductor device according to the present embodiment has the bit line 54 width, which is much smaller than the 160 nm, the resolution limit of the current photolithography. This enables the semiconductor device to be micronized and to be more integrated. The bit lines 54 of such small width can be formed by the process for fabricating the semiconductor device according to the present embodiment. The semiconductor device according to the present embodiment can have the bit lines 54 more thinned by the process for fabricating the semiconductor device according to the present embodiment which will be explained later.

A protection film 59 of an about 10–30 nm-thickness silicon nitride film is formed on the entire surface of the silicon oxide film 38 with the bit lines 54 formed on. The bit lines 54 are coated with the thin protection film 59, whereby a voltage resistance between the bit lines 54 and the conductor plugs 37 can be high, and a disalignment margin can be ensured.

An inter-layer insulation film 60 of a 700 nm-thickness BPSG film is formed on the entire surface of the protection film 59. Contact holes 35 which reaches the conductor plugs 36 are formed in the inter-layer insulation film 60, the protection film 59 and the silicon oxide film 38. Conductor plugs 37 are buried in the contact holes 35. It is one of characteristics of the semiconductor device according to the present embodiment that the contact holes 35 has so small diameter as 80 nm×80 nm, and the conductor plugs 37 are buried in the micronized contact holes 35. Such micronized contact holes 35 can be formed by the process for fabricating the semiconductor device according to the present embodiment, which will be explained later. As described above, the semiconductor device according to the present embodiment has a very small width of the bit lines 54 and the micronized contact holes 35, so that even when the semiconductor device is micronized, the conductor plugs 37 and the conductor plugs 36 can be connected to each other without the use of SAC.

In the conventional semiconductor device fabricated by using SAC the sidewall insulation film on the side walls of the bit lines is formed of silicon nitride film, and such sidewall insulation film has large parasitic capacities. In contrast to this, in the semiconductor device according to the present embodiment the micronized bit lines 54 and the micronized conductor plugs 37 can be formed without the use of SAC. Accordingly, no sidewall insulation film having a large parasitic capacity is necessary on the side walls of the bit lines 54, with a result that a parasitic capacity between the bit lines 54 and the conductor plugs 37 can be small.

An etching stopper film 61 of a 50 nm-thickness silicon nitride film is formed on the inter-layer insulation film 60. Openings 66 which reach the conductor plugs 37 are formed in the inter-layer insulation film 60 and the etching stopper film 61. The openings 66 are formed partially below the etching stopper film 61.

The storage electrode 68 of each capacitor 79 is formed, partially buried in the opening 66. That is, the storage electrode 68 is formed with lower parts of the side surfaces of the storage electrode 68 intruding into below the etching stopper film 61. The storage electrodes 68 are connected to the conductor plugs 37. In the semiconductor device according to the present embodiment, the storage electrodes 68 of the capacitors 79 are formed partially below the etching stopper film 61, whereby the storage electrodes 68 are secured by the etching stopper film 61, which secures the storage electrodes 68 to the base without failure. The storage electrodes 68 are prohibited from peeling off, and the semiconductor device can have high fabrication yields.

The semiconductor device according to the present embodiment is characterized in that a rough-surface polysilicon film of coarse film quality is formed on the storage electrodes 68. The rough-surface polysilicon film of the coarse film quality can have a large surface area, and accordingly the capacitors 79 can have a large capacitance.

A dielectric film 72 of a 4 nm-thickness silicon nitride film is formed on the entire surface of the storage electrode 68 and the etching stopper film 61. Opposed electrodes 77 of a 1 μm-thickness polysilicon film is formed on the dielectric film 72. The semiconductor device according to the present embodiment is thus constituted.

As described above, according to the present embodiment, the bit lines have a very small width, and the conductor plugs are also micronized. Accordingly, it is not necessary to form on the side walls a sidewall insulation film of silicon nitride film having high dielectric constant. A parasitic capacity between the bit lines and the conductor plugs can be low.

Furthermore, according to the present embodiment, the storage electrodes are formed with the lower ends partially formed below the etching stopper film, whereby the storage electrodes can be secured by the etching stopper film. Accordingly, the storage electrodes can be hindered from peeling off by the processing, as of wet etching or others, which enables the semiconductor device to be fabricated at high yields.

In addition, according to the present embodiment, the bit lines are covered with the protection film of a thin nitride film, whereby voltage resistance can be ensured between the bit lines and the storage electrodes. The protection film can improve close contact between the bit lines and the inter-layer insulation film, whereby the inter-layer insulation film formed on the bit lines is prevented from peeling off.

(Process for Fabricating the Semiconductor Device)

Next, the process for fabricating the semiconductor device according to the present embodiment will be explained with reference to FIGS. 4A to 9B. The views of FIGS. 4A to 9B on the left side are sectional views along the line A–A' in FIGS. 2 and 3, i.e., along a bit line of the DRAM. The views of FIGS. 4A to 9B at the center are sectional views along the line B–B' in FIGS. 2 and 3, i.e., along a word line of the DRAM. The views of FIGS. 4A to 9B on the right side are a sectional views of peripheral transistors.

First, the device isolation region 12 is formed by STI (Shallow Trench Isolation). The device isolation region 12 can be formed by STI as follows. That is, first, a 150 nm-thickness silicon nitride film (not shown) is formed on a silicon substrate 10. Then, the silicon nitride film is patterned in a shape of the device isolation region 12. Next, the silicon substrate 10 is etched by 400 nm depth with the silicon nitride film as a mask. Then, a 800 nm-thickness silicon oxide film (not shown) is formed on the entire surface by CVD. Next, the silicon oxide film is polished by CMP until the surface of the silicon nitride film is exposed. Then, the silicon nitride film is released. Thus, the device isolation region 12 is formed by STI, and device regions 11 (see FIG. 2) are defined (see FIG. 4A).

Next, impurity ions are implanted in the silicon substrate 10 to form wells (not shown) in the device regions 11. Then, the gate oxide film 13 of a 6.5 nm thickness is formed on the surface of the silicon substrate 10 by thermal oxidation.

Next, the 50 nm-thickness polysilicon film 14, the 100 nm-thickness tungsten silicide film 16 and the reflection preventing film 18 of the 60 nm-thickness silicon nitride oxide film, and the 130 nm-thickness silicon nitride film 20 are formed by CVD. Thus, the layer film of the polysilicon film 14, the tungsten silicide film 16, the reflection preventing film 18 and the silicon nitride film 20 is formed. Then, the layer film is patterned in a planar shape of the gate electrodes 24. Thus, the gate electrodes 24 which function also as the word lines of the transfer transistors are formed, and the gate electrodes 24a, 24b of the transistors of peripheral circuits (hereinafter called peripheral transistors), such as sense amplifier unit, sub-word decoder unit, etc.

Next, impurity ions are implanted in the gate electrodes 24, 24a, 24b by self-alignment to form the lightly doped diffused layers 26, 27, 29a in the device regions 11. Thus, the source/drain diffused layers 26, 27 of the lightly doped layer is formed.

Next, the 60 nm-thickness silicon nitride film is formed on the entire surface, and then the silicon nitride film is anisotropically etched to form the sidewall insulation film 28 of the silicon nitride film of an about 50 nm thickness on the side walls of the gate electrodes 24, 24a, 24b.

Next, a photoresist (not shown) opened for the device region of the peripheral transistors is formed. With the photoresist as a mask, impurity ions are heavily implanted. Thus, the impurity ions are implanted by self-alignment in the gate electrodes 24a, 24b with the sidewall insulation film 28 formed on. Thus, the source/drain diffused layer 29 of the LDD (Lightly Doped Drain) structure of the lightly doped diffused layer 29a and the heavily doped diffused layer 29b.

The etching stopper film 30 of the 20 nm-thickness silicon nitride film is formed on the entire surface by CVD (see FIG. 4B).

Next, the inter-layer insulation film 32 of the 500 nm-thickness BPSG film is formed by CVD. Next, the surface of the inter-layer insulation film 32 is planarized by reflow or CMP. Then, the inter-layer insulation film 32 is etched by SAC at a high selection ratio to the silicon nitride film 20, 30 covering the gate electrode 24, and the sidewall insulation film 28. The contact hole 34 arriving at the source/drain diffused layer 27 is formed. The contact hole 34 is formed by SAC, which allows a disalignment margin for the photolithograph to be large.

A polysilicon film is formed on the entire surface by CVD. Then, the polysilicon film is polished until the surface of the inter-layer insulation film 32 is exposed to form the conductor plug 36 of the polysilicon film in the contact hole (see FIG. 5A).

Next, the 100 nm-thickness silicon oxide film 38 is formed on the entire surface by CVD. Then, the contact hole 33 reaching the gate electrode 24b of the peripheral transistor is formed by anisotropic etching under conditions of low selectivity with respect to the silicon nitride film 20. An etching gas for forming the contact hole 33 may be a mixed gas of, e.g., $CHF_3$ gas, Ar gas, $O_2$ gas, etc. (see FIG. 5B).

Then, the silicon oxide film 38 and the inter-layer insulation film 32 are etched at a high selectivity ratio to the sidewall insulation film 28 and the silicon nitride film 30 to form the contact hole 40 reaching the source/drain diffused layer 26 of a transfer transistor and the contact hole 41 reaching the source/drain diffused layer 29 of the peripheral transistor. As an etching condition, an etching gas may be, e.g, a mixed gas of $C_4F_8$ gas, $CHF_2$ gas, Ar gas, $O_2$ gas, etc.

One of characteristics of the process for fabricating the semiconductor device according to the present embodiment is that the step of forming the contact hole 33 arriving at the gate electrode 24b of the peripheral transistor and the process for forming the contact hole 40 reaching the source/drain diffused layer 26 are separate from each other. The contact holes 33, 40 are formed thus in the separate steps form each other for the following reason. That is, to form the contact hole 33 the silicon nitride film 20 must be etched, and accordingly the etching must be performed at a low selectivity ratio to the silicon nitride film 20, and to form the contact hole 40 the etching must be performed at a high selectivity ratio to the silicon nitride films 20, 30 and the sidewall insulation film 28.

In the process for fabricating the semiconductor device according to the present embodiment, the contact hole 33 of the peripheral transistor, which reaches the gate electrode 24b, is formed in the preceding step, and the contact hole 40 of the cell transistor, which arrives at the source/drain diffused layer 26, is formed the later step. The contact holes 33, 40 are formed in such sequence for the following reason. When the contact hole 40 reaching the source/drain diffused layer 26 of the transfer transistor in the preceding step, the resist fills the contact hole 40 when the contact hole 33 arriving at the gate electrode 24b is formed, and the resist filling the contact hole 40 cannot be perfectly removed with a result that the contact between the conductor plug 36 and the source/drain diffused layer 26 becomes less reliable. Accordingly, in the present embodiment, the contact hole 40 of the transfer transistor, which arrives at the source/drain diffused layer 26, is formed after the contact hole 33 of the peripheral transistor, which arrives at the gate electrode 24b (see FIG. 6A).

Then, the surfaces of the silicon substrate 10 exposed in the contact holes 40, 41 are etched by isotropic etching. An etching gas may be, e.g., $CF_4$ gas, Ar gas or others. This etches the surface of the silicon substrate 10, which has been damaged when the contact holes 40, 41 were formed. Good contact can be obtained between the source/drain diffused layer 26 and the bit lines 54, and good contact can be obtained between the source/drain diffused layer 29 and the wiring 55b.

Next, the 40 nm-thickness polysilicon film 42 and the 160 nm-thickness tungsten silicide film 44, and the reflection preventing film 46 of the 50 nm-thickness silicon nitride oxide film are formed entire surface by CVD. Thus, the layer film of the polysilicon film 42, the tungsten silicide film 44 and the reflection preventing film 46 is formed.

Subsequently, a heat treatment is made by RTA (Rapid Thermal Anneal). This heat treatment makes the contact between the gate electrode 24b and the wiring 55a good. Condition of the heat treatment may be, e.g., 1000° C., and several second to several tens of seconds of annealing time.

When the bit lines 54 are formed to have the W/TiN/Ti structure, the layer film is formed as follows. That is, a 40 nm-thickness titanium film is formed on the entire surface by CVD or sputtering. Then, the titanium film is subjected to a heat treatment by RTA at 700° C. for 30 seconds to be silicided. Next, a 20 nm-thickness titanium nitride film is formed by CVD or sputtering and is subjected to a heat treatment by RTA at 700° C. for 30 seconds. Next, a 100 nm-thickness tungsten film and a 80 nm-thickness silicon nitride oxide film are sequentially formed by CVD. Thus the layer film is formed. In this case, good contact can be ensured between the gate electrode 24b and the wiring 55a without additional heat treatments, because the heat treatments are performed in forming the layer film.

Next, a photoresist mask for patterning the layer film is formed. In the process for fabricating the semiconductor device according to the present embodiment, for the purpose of enabling micronized processing, a KrF excimer laser of the short wavelength is used for the exposure. A material of the photo-resist film is a chemical amplifying type resist corresponding to a wavelength of the KrF excimer laser. The minimum dimension of the resolution limit of the current technique is about 160 nm for the exposure by a KrF excimer laser. Accordingly, a pattern of the photo-resist film is formed to be, e.g., 160 nm in regions corresponding to the bit lines 54.

Then, the photoresist is isotropically etched by plasma etching. This thins a pattern width of the photoresist film in the regions corresponding to the bit lines 54 by, e.g., 20 nm on one side and totally by, e.g., 40 nm. Thus a width of the photoresist mask in the regions corresponding to the bit lines 54 is, e.g., 120 nm. In the isotropic etching of the photoresist film, a parallel plate etching system of two wavelengths, for example, may be used. Applied voltages may have, for example, 27 MHZ and 500 W for the opposed electrode and RF (Radio Frequency) and 30 W for the silicon substrate side.

An etching gas is a mixed gas of, e.g., $N_2$ gas and $O_2$ gas. A pressure may be, e.g., 3.99 Pa (30 mTorr). A gas flow rate may be 150 cc/min for the $N_2$ gas and 15 cc/min for the $O_2$ gas. An etching time may be, e.g., 20 seconds. Thus, a photoresist mask of a pattern of, e.g., 120 nm width in the regions corresponding to the bit lines 54 can be formed.

A width of the pattern of the photoresist mask can be set by suitably adjusting the etching time. In the process for fabricating the semiconductor device according to the present embodiment, an etching gas is a mixed gas of $N_2$ gas and $O_2$ gas, but the etching gas is not limited to the above-described mixed gas and may be, e.g., a mixed gas of HBr gas and $O_2$ gas, or others.

In a case that the photoresist mask is formed of a thin photoresist film, it is preferable to use an ozone asher. This is because by using an ozone asher, decrease of a thickness of the photoresist mask in the vertical direction of the substrate can be depressed. The layer film is etched by using the thus-formed photoresist mask as a mask, whereby the bit lines can be formed in a smaller width than the resolution limit of the current photolithography technique.

As described above, according to the present embodiment, the photoresist film is patterned and is additionally isotropically etched to form the photoresist mask, and by using the photoresist mask, the bit lines can have a smaller width than the resolutionlimit of the current photolithography technique. According to the present embodiment, the gate electrode 54b and the wiring 55a of the peripheral transistor can be connected directly to each other, which facilitates layout of the wiring 55a, and contributes to micronization of the semiconductor device.

Then, the protection film 59 of a 10–30 nm-thickness silicon nitride film is formed on the entire surface by CVD. Next, the protection film 59 may be anisotropically etched to be left only on the side walls of the bit lines 54. It is possible that by using a mask covering cell array portions, only that of the protection film 59 in the peripheral circuit portions is etched. The bit lines 54 formed of a metal film, such as the bit lines of a W/TiN/Ti structure has poor adhesion to the inter-layer insulation film 60, and the inter-layer insulation film 60 is easily released. In such case, it is preferable that the protection film 59 is not etched, but the inter-layer insulation film 60 is formed on the protection film 58 formed on the entire surface.

Next, the inter-layer insulation film 60 is formed of a 700 nm-thickness HDP-USG (High Density Plasma-Undoped Silicate Grass) is formed on the entire surface by CVD. The inter-layer insulation film 60 is not essentially formed of the HDP-USG film and may be formed of another insulation film, e.g., BPSG film or others (see FIG. 6B).

Then, a etching stopper film 80 of a 200 nm-thickness polysilicon film is formed on the inter-layer insulation film 60. The etching stopper film 80 functions as an etching stopper in etching the inter-layer insulation film 60 to form the contact holes 35. It is preferable that a material having a high selectivity ratio to the inter-layer insulation film 60 is used. Accordingly, the etching stopper film 80 is not essentially formed of polysilicon film and may be formed of, e.g., silicon nitride film or alumina ($Al_2O_3$) film or others.

Then, the etching stopper film 80 is patterned to form openings 81 in the etching stopper film 80 at regions corresponding to the contact holes 35. At this time, it is preferable that a depth which will etch the inter-layer insulation film 60 therebelow is limited to be, below 100 nm. Next, a 100 nm-thickness polysilicon film is formed on the entire surface. The polysilicon film is used because of its high selectivity ration to the inter-layer insulation film 60 in forming the contact holes in the inter-layer insulation film 60 in a later step. Accordingly, polysilicon film is not essentially used, and a film, e.g., silicon nitride film, alumina film or others, having a high selectivity ration to the inter-layer insulation film 60 may be suitably used.

Then, the polysilicon film is anisotropically etched to form sidewalls 82 on the side walls of the etching stopper film 80. Because of the sidewalls 82 formed on the side walls of the etching stopper film 80, openings 84 having a diameter reduced by a thickness of the sidewalls 82 can be formed. Thus, the etching stopper film 80 and the side walls 82 form a mask 86 (see FIG. 7A).

Next, the inter-layer insulation film 60, the protection film 59 and the silicon oxide film 38 are sequentially anisotropically etched, using the mask 86 to form the contact holes 35 arriving at the conductor plugs 36. In etching the inter-layer insulation film 60, a mixed gas of, e.g., $C_4F_8$ gas, $CH_2F$ gas, Ar gas and $O_2$ gas, etc. may be used so that the inter-layer insulation film 60 can be etched at a high selectivity ratio to the etching stopper film 80 of polysilidon film, the sidewalls 82 of polysilicon film and the protection film 59 of silicon nitride film. In etching the protection film 59, a mixed gas of, e.g., $CHF_3$ gas, Ar gas and $O_2$ gas may be used so that the protection film 60 can be etched at a high selectivity ratio to the etching stopper film 80 of polysilicon film, the sidewalls 82 of polysilicon film and the silicon oxide film 38. A mixed gas of $CH_2F_2$ gas, Ar gas and $O_2$ gas may be used. In etching the silicon oxide film 38, a mixed gas of, e.g., $C_4F_8$ gas, $CH_2F_2$ gas, Ar gas and $O_2$ gas may be used so that the silicon oxide film 38 can be etched at a high selectivity ratio to the etching stopper film 80 of polysilicon film and the sidewalls 82 of polysilicon film. Thus, the contact holes 35 arriving at the conductor plugs 36 can be formed. The contact holes 35 can be micronized because the openings 84 in the mask 86 have a diameter smaller than a photolithographic resolution limit.

Next, a 200 mm-thickness polysilicon film is formed on the entire surface. Then, the polysilicon film is polished by CMP until the surface of the inter-layer insulation film 60 is exposed to form the conductor plugs 37 of the polysilicon film in the contact holes 35 (see FIG. 7B).

Next, an etching stopper film 61 of a 50 nm-thickness silicon nitride film is formed on the entire surface. Next, the insulation film 64 of a 0.8–1.2 μm-thickness, preferably a 1 μm-thickness BPSG film is formed on the entire surface (see FIG. 8A).

Then, the insulation film 64 is etched with the etching stopper film 61 as an etching stopper. Openings 66 corresponding to the regions where the storage electrodes 68 of the capacitors 79 to be formed in are formed. Next, the etching stopper film 61 exposed in the openings 66 is etched to expose the upper surfaces of the conductor plugs 37. At this time, not only the etching stopper film 61 but also the inter-layer insulation film 60 are etched by a prescribed depth. A depth by which the inter-layer insulation film 60 is etched can be about 100 nm from the surface of the inter-layer insulation film 60.

Then, the inter-layer insulation film 60 below the etching stopper film 61 is side-etched by HF-based wet etching. A transverse distance of the side-etching as viewed in the drawing can be 2–20 nm, e.g., about 10 nm. Thus, the openings 66 are formed deeper than the etching stopper film 61 (see FIG. 8B).

Next, a 50 nm-thickness amorphous silicon film is formed on the entire surface by CVD. The amorphous silicon film is formed even below the side-etched etching stopper film 61. Then, a 1.3 μm-thickness resist film (not shown) is formed on the entire surface, and the amorphous silicon film and the resist film are polished until the surface of the insulation film 64 is exposed. Thus, the storage electrodes 68 of the amorphous silicon film are formed in the openings 66. Then, the resist film is removed by ashing. Thus, the cylindrical storage electrodes 68 are formed.

Next, the insulation film 64 is etched by HF-based wet etching. The storage electrodes 68 are fixed by the etching stopper film 61 because the storage electrodes 68 are formed even below the underside of the etching stopper film 61, whereby the storage electrodes 68 are prevented from peeling off by the HF-based wet etching (see FIG. 9A).

Then, an about 30 nm-thickness rough-surface polysilicon film having convexities and concavities in the surface is selectively grown on the surface of the storage electrodes 68 and then is subjected to vacuum annealing to roughen the surfaces of the storage electrodes 68. The surfaces of the storage electrodes 68 may not be roughened in a case that the capacitors can have a sufficient capacitance without roughening the surfaces of the storage electrodes 68. In the case that the surfaces of the storage electrodes 68 are roughened, a concentration of the phosphorous, an impurity in the storage electrodes 68 is decreased, often causing depletion. In case that the depletion may take place in the storage electrodes 68, the storage electrodes 68 which has been roughened is annealed in, e.g., a $PH_3^+$ atmosphere of 700° C. to gas-phase diffuse phosphorous in the storage electrodes 68 to increase an impurity concentration in the storage electrodes 68;

Next, annealing is performed on the entire surface in an $NH_3$ atmosphere to nitrify the surface of the storage electrodes 68. Then, a dielectric film 72 of a 4 nm-thickness silicon nitride film is formed by CVD. Next, an oxidation thermal treatment of about 800° C. is made to improve characteristics of the capacitors. Then, the opposed electrodes 77 of a 1 μm-thickness polysilicon film are formed.

The dielectric film 72 is formed of silicon nitride film, but silicon nitride film is not essential. The dielectric film 72 may be formed of, e.g., a high dielectric film or others, such as $Ta_2O_5$ or others. Resultantly, the capacitors 79 having a high capacitance can be formed. For example, when the dielectric film 72 is formed of $Ta_2O_5$, first the surfaces of the storage electrodes 68 are nitrified by RTN to form silicon nitride film. Then, a $Ta_2O_5$ film of, e.g., 8 nm thickness is formed by CVD. Next, an oxidation treatment of 800° C., $O_2$ plasma annealing or others is performed. Next, a 50 nm-thickness titanium nitride film and a 100 nm-thickness polysilicon film are formed to form the opposed electrodes 77. Thus, the capacitors 79 of a highly dielectric film, such as $Ta_2O_5$ or others are formed.

Then, another inter-layer insulation film (not shown) is formed on the opposed electrodes 77, Furthermore, a wiring layer, etc. (not shown) are formed, and the semiconductor device according to the present embodiment is fabricated.

(Modification)

Figure 10A:
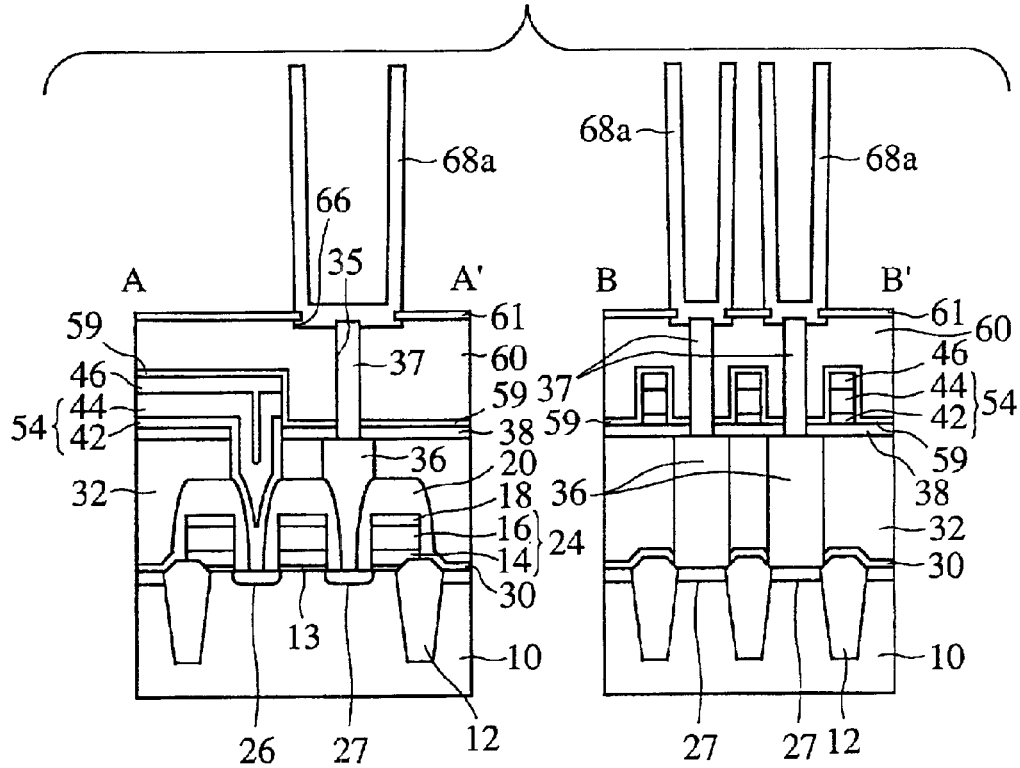
FIGS. 10A and 10B are sectional views of the semiconductor device according to a modification of the first embodiment of the present invention in the steps of the process for fabricating the same, which explain the process.
Figure 10B:
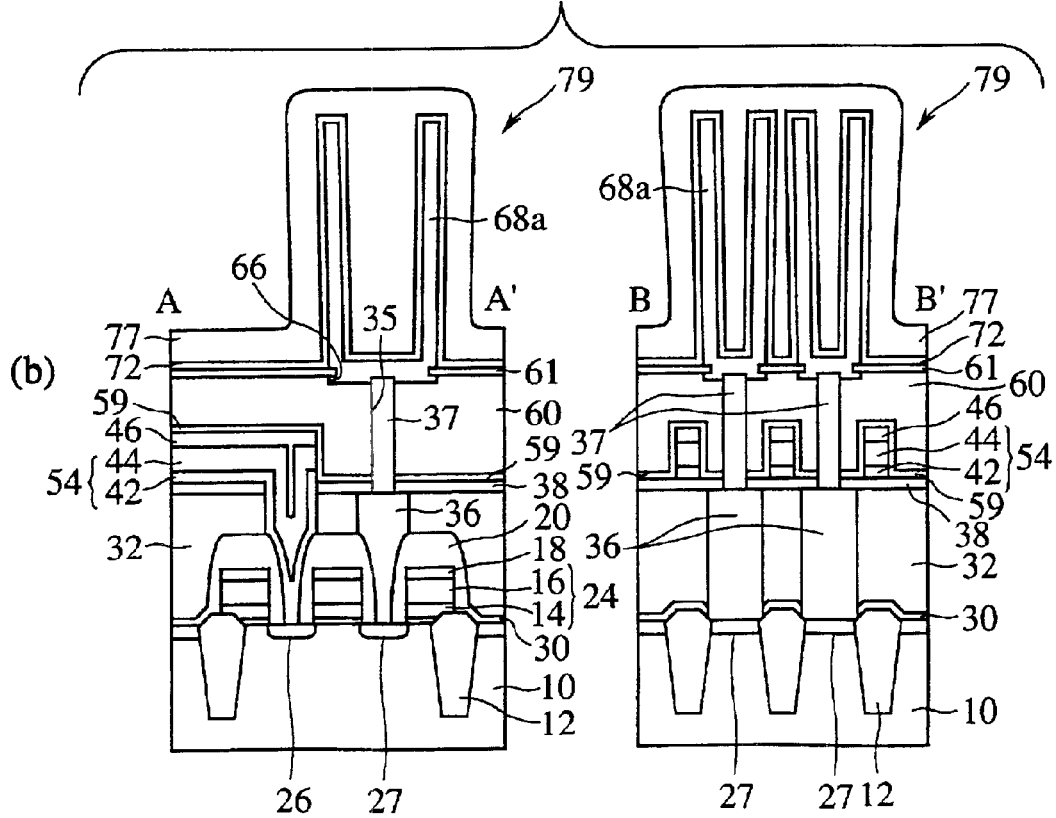

Next, the process for fabricating the semiconductor device according to a modification of the present embodiment will be explained with reference to FIGS. 10A and 10B. FIGS. 10A and 10B are sectional views of the semiconductor device according to the modification in the steps of the process for fabricating the same, which explain the process.

The semiconductor device according to the present modification is mainly characterized in that the storage electrodes 68a are formed of porous polysilicon film.

The steps up to the step of forming the openings 66 including the step are the same as those of the process for fabricating the semiconductor device according to the first embodiment, and these steps are not explained here.

Then, a 50–100 nm-thickness porous polysilicon film is formed on the entire surface by CVD. Film forming conditions may be, e.g., an about 570° C. film forming temperature, and $SiH_4$ gas. In a case that the porous polysilicon film is formed under these conditions, the porous polysilicon film has a film quality having large grains having large grain diameters are coarsely present.

The porous polysilicon film may be formed as follows. That is, an about 30 nm-thickness amorphous silicon film is formed. Then, an about 30 nm-thickness polysilicon film is formed at a 570° C. film forming temperature and $SiH_4$ gas. Next, vacuum annealing is performed for a few tens of minutes at 560° C. and at $133 \times 10^{-8}$ Pa ($10^{-8}$ Torr) to thereby grow the grains to form the porous polysilicon film.

Next, a 1.3 μm-thickness resist film (not shown) is formed on the entire surface, and the porous polysilicon film and the resist film are polished until the surface of the insulation film 64 is exposed. Thus, the storage electrodes 68a of the porous polysilicon film are formed in the openings 66. Next, the resist film is removed by ashing. Thus, the storage electrodes 68a which are cylindrical are formed (see FIG. 10A).

Then, the insulation film 64 is etched by HF-based wet etching. In the present modification, the storage electrodes 68a are formed of the porous polysilicon film, and the etchant goes on permeating outward from the insides of the storage electrodes 68a through the pores of the storage electrodes 68a. Thus, the etchant quickly permeates into the insulation film 64 between the storage electrodes 68a to thereby quickly etch the insulation film 64. Accordingly, the insulation film 64 in the cell portion can be quickly etched, leaving the insulation film 64 in the region other than the cell portion. Specifically, the etching reduces only by 5–10% the film thickness of the insulation film 64 in the region other than the cell portions. Because of the insulation film 64 left in the region other than the cell portions, a step between the cell portions and the region other than the cell portions, which have been conventionally formed, can be reduced.

As described above, according to the present modification, the storage electrodes are formed of a porous polysilicon film, whereby the capacitors can have a large capacitance. Furthermore, according to the present modification, the HF-based etchant permeates into the storage electrodes through the pores when the insulation film 64 is etched, which permits the insulation film 64 between the storage electrodes to be quickly etched, with the insulation film 64 in the region except the cell portions left. Accordingly, even in a case that the semiconductor device has cylindrical capacitors, the steps between the cell portions and the regions except the cell portions can be reduced.

[A Second Embodiment]

Figure 11:
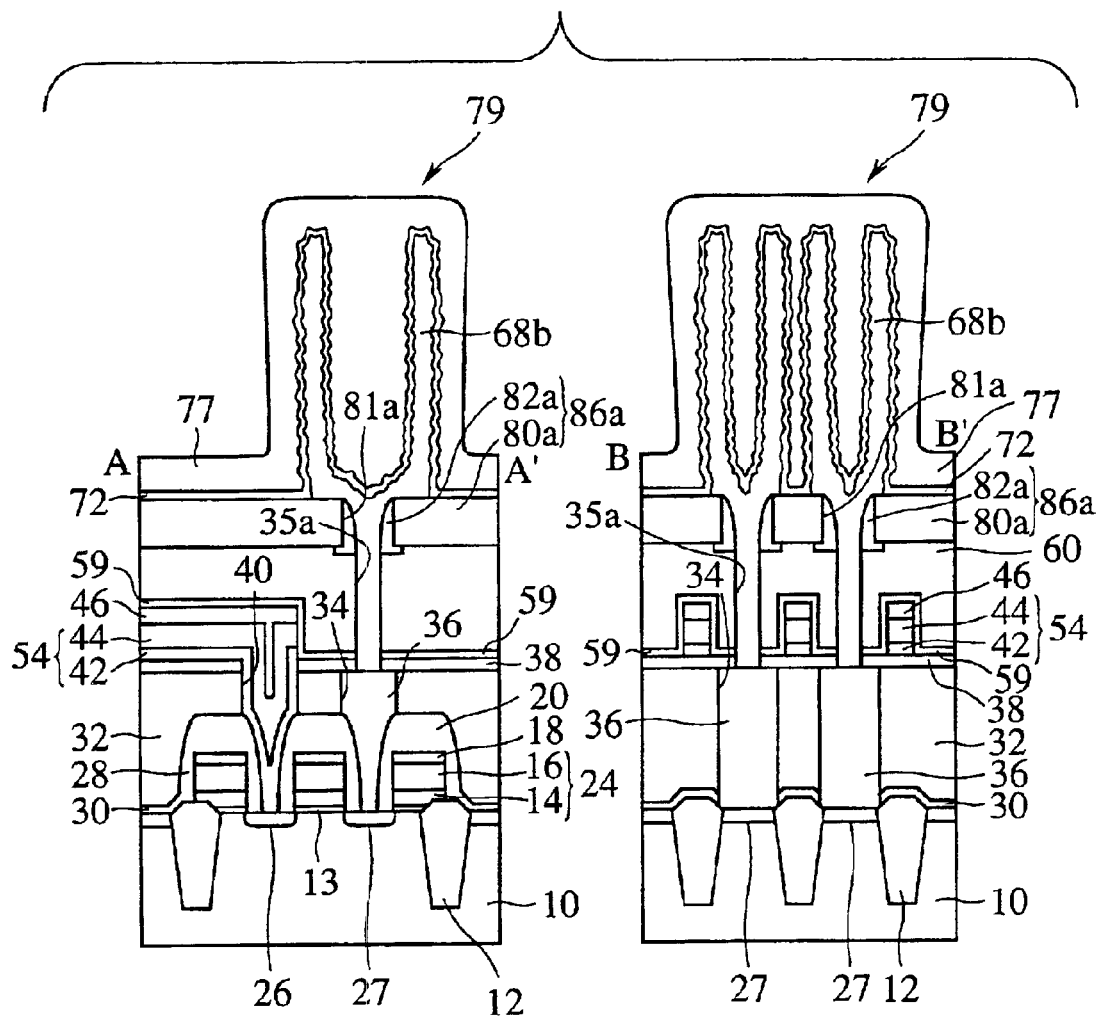
FIG. 11 is sectional views of the semiconductor device according to a second embodiment of the present invention.
Figure 12A:
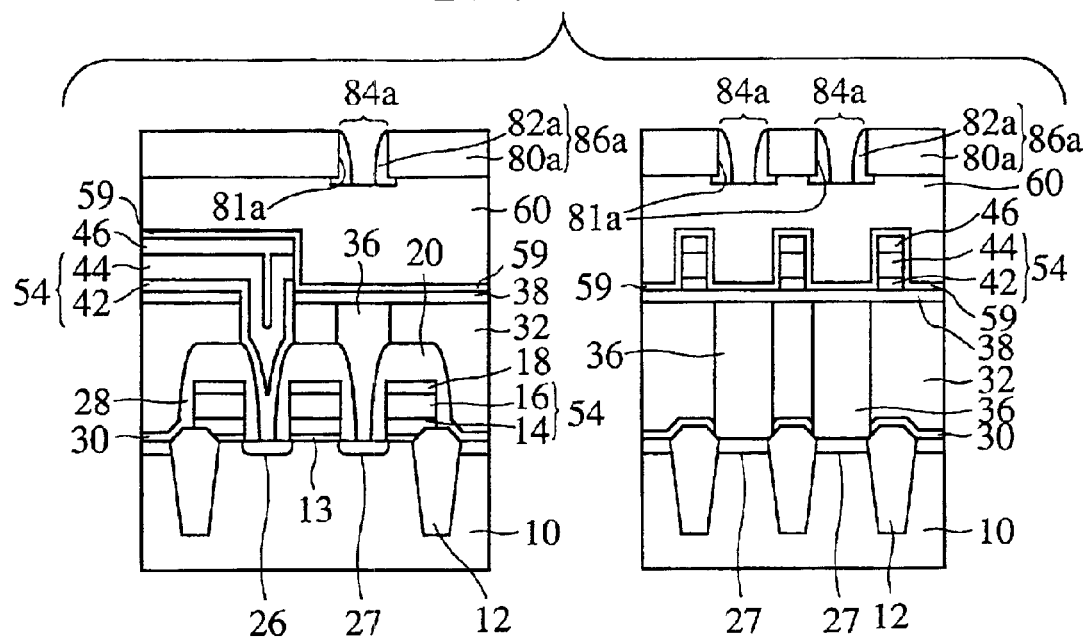
FIGS. 12A and 12B are sectional views of the semiconductor device according to the second embodiment of the present invention in the steps of the process for fabricating the same, which explain the process (Part 1).
Figure 12B:
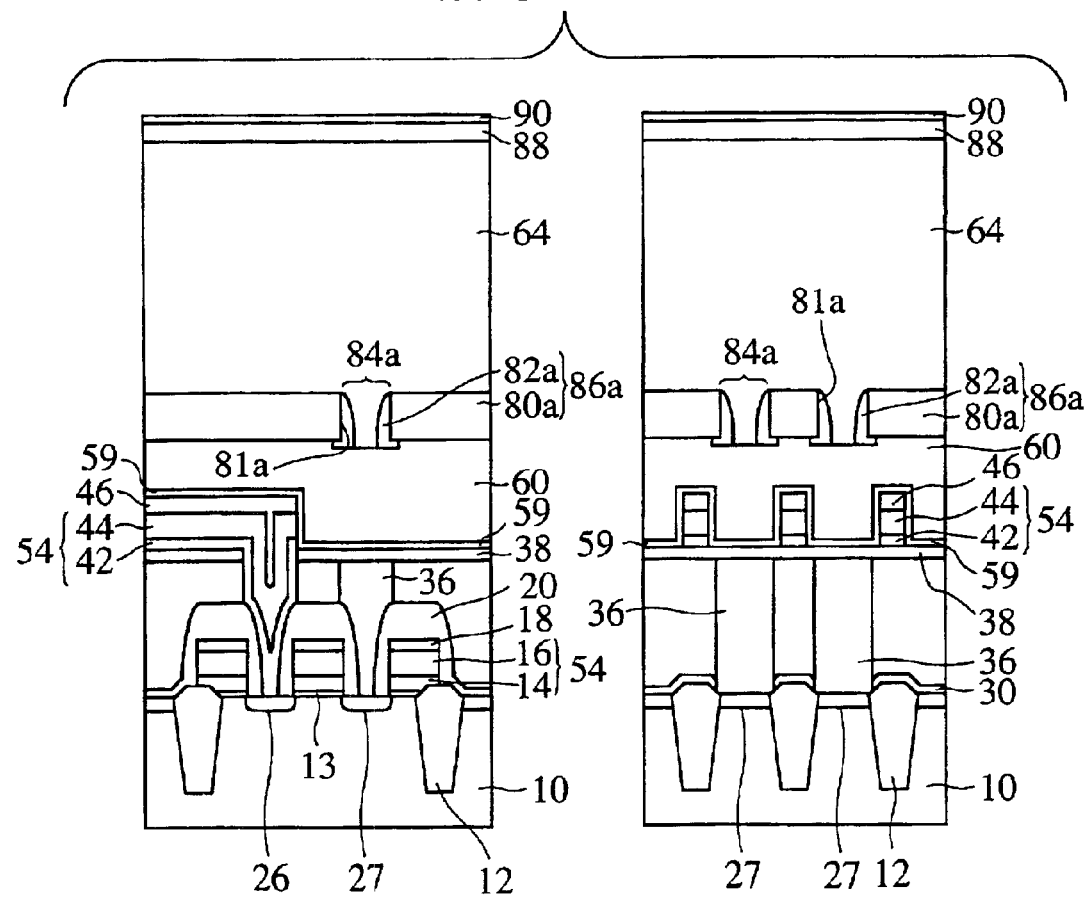
Figure 13A:
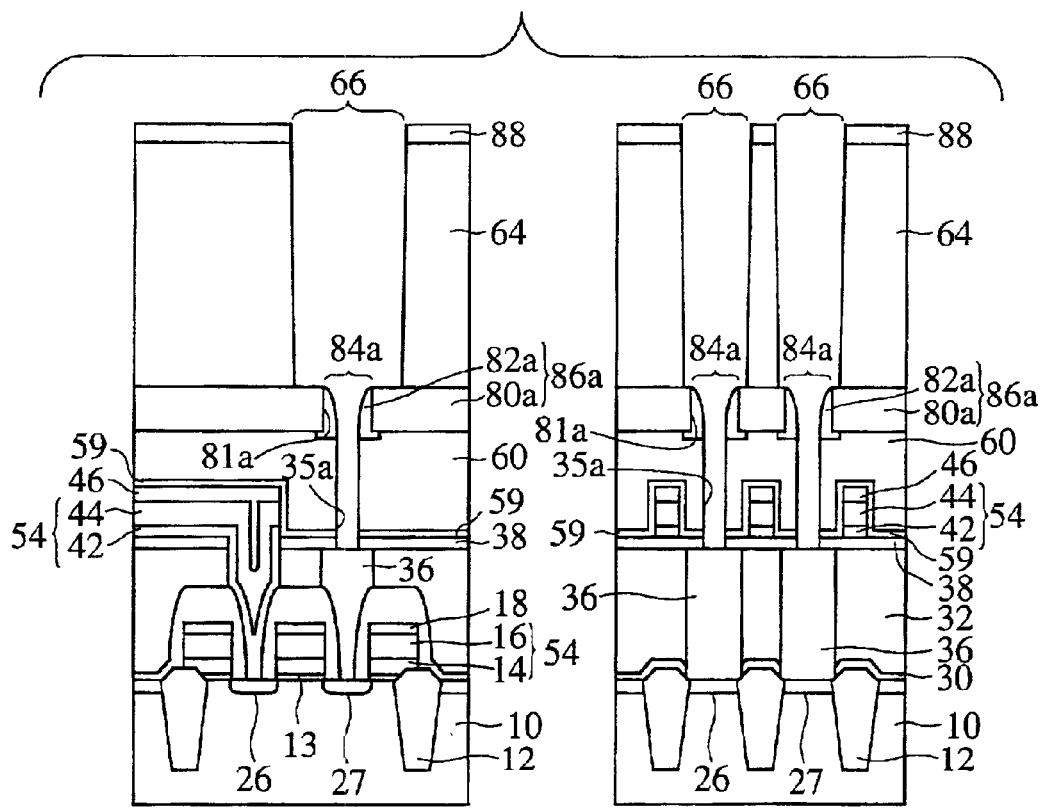
FIGS. 13A and 13B are sectional views of the semiconductor device according to the second embodiment of the present invention in the steps of the process for fabricating the same, which explain the process (Part 2).
Figure 13B:
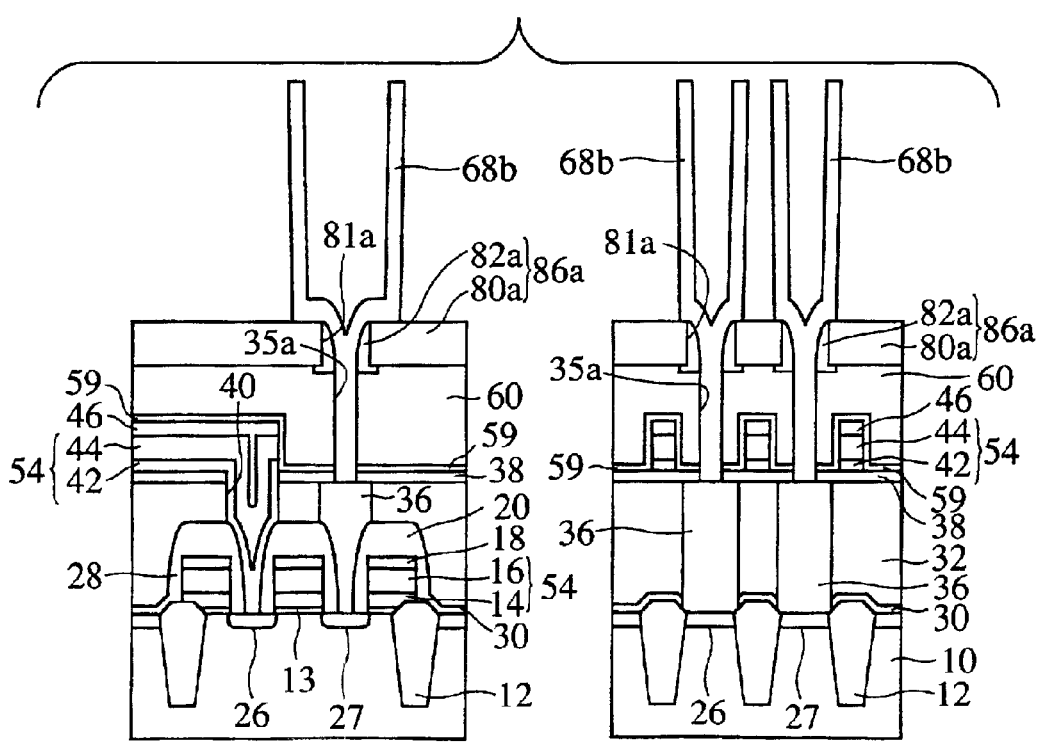
Figure 14:
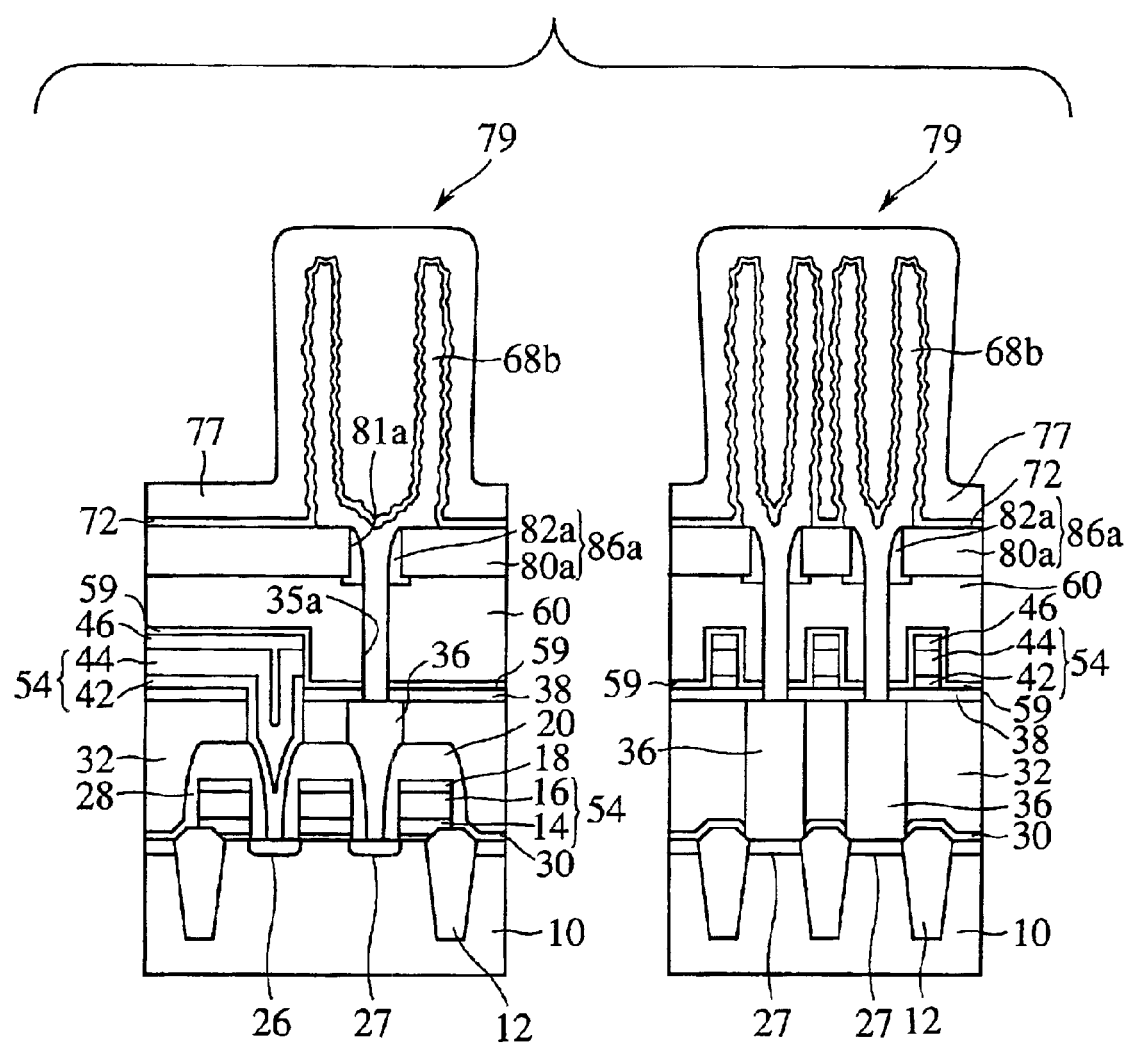
FIG. 14 is sectional views of the semiconductor device according to the second embodiment of the present invention in the steps of the process for fabricating the same, which explain the process (Part 3).
Figure 15A:
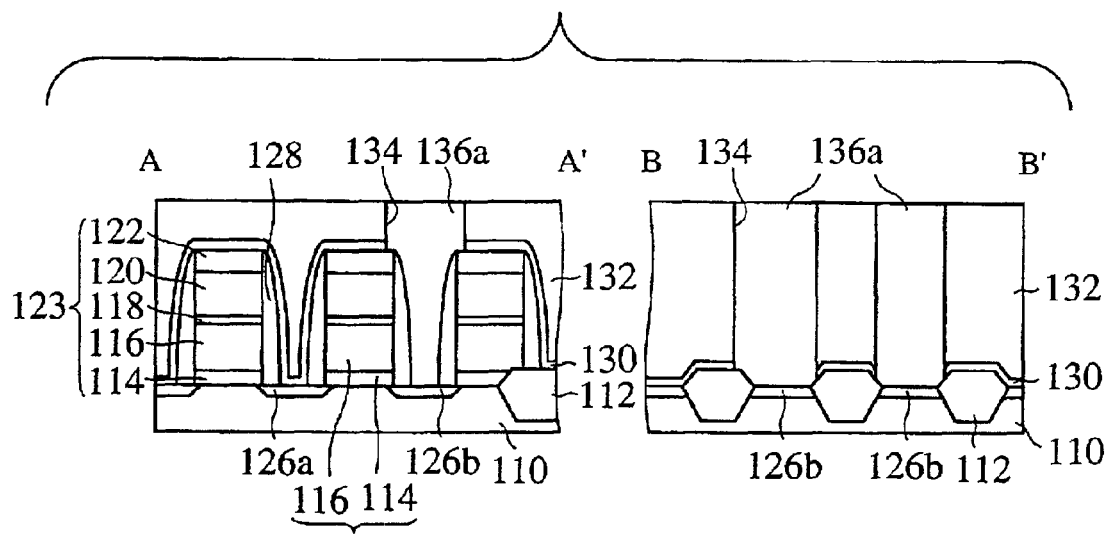
FIGS. 15A and 15B are sectional views of the conventional semiconductor device in the steps of the process for fabricating the same, which explain the process (Part 1).
Figure 15B:
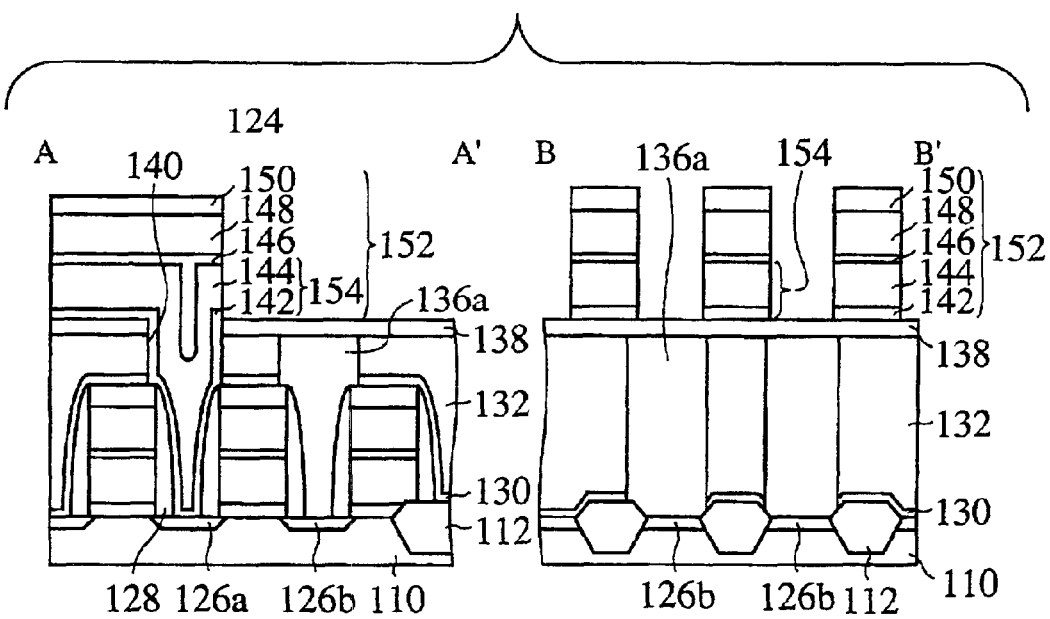
Figure 16A:
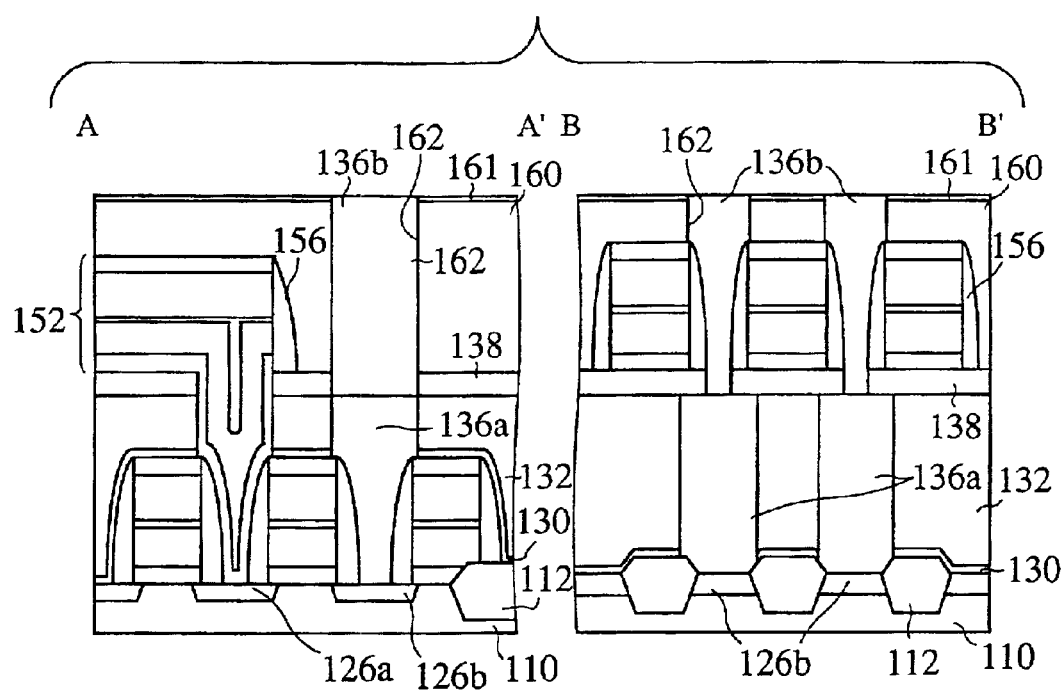
FIGS. 16A and 16B are sectional views of the conventional semiconductor device in the steps of the process for fabricating the same, which explain the process (Part 2).
Figure 16B:
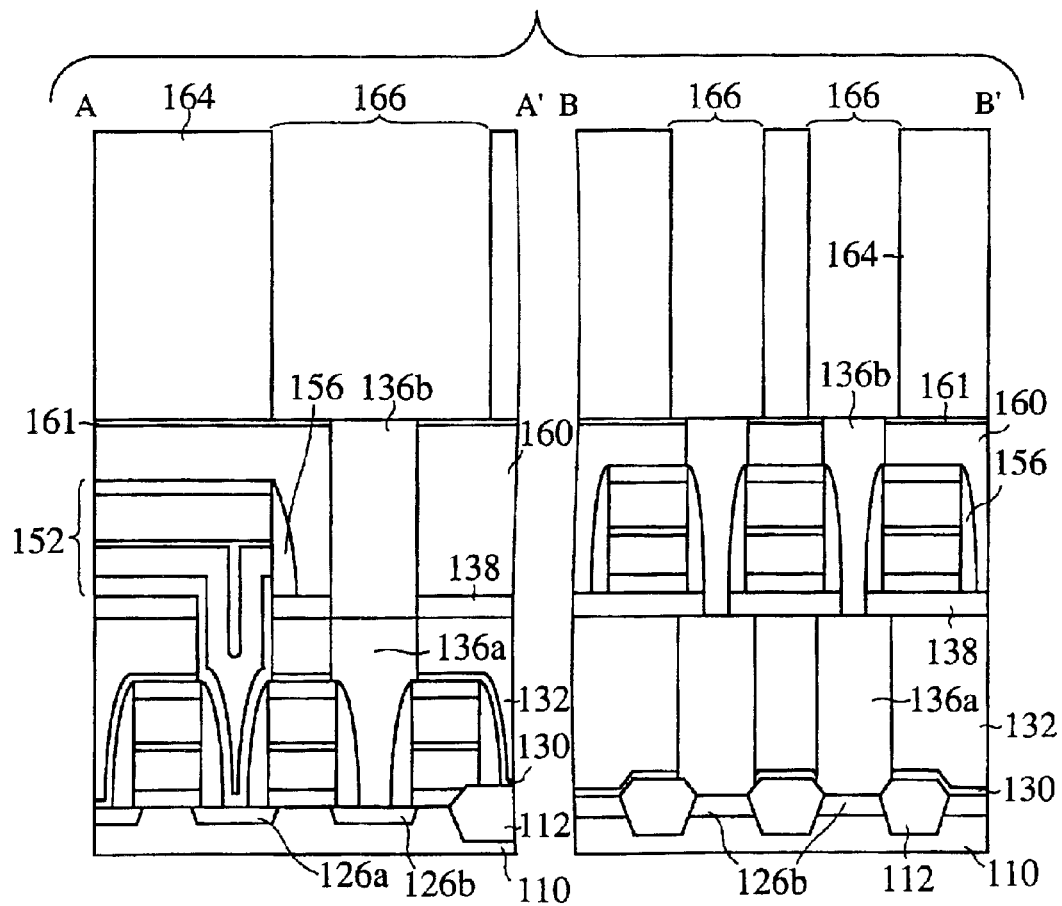
Figure 17:
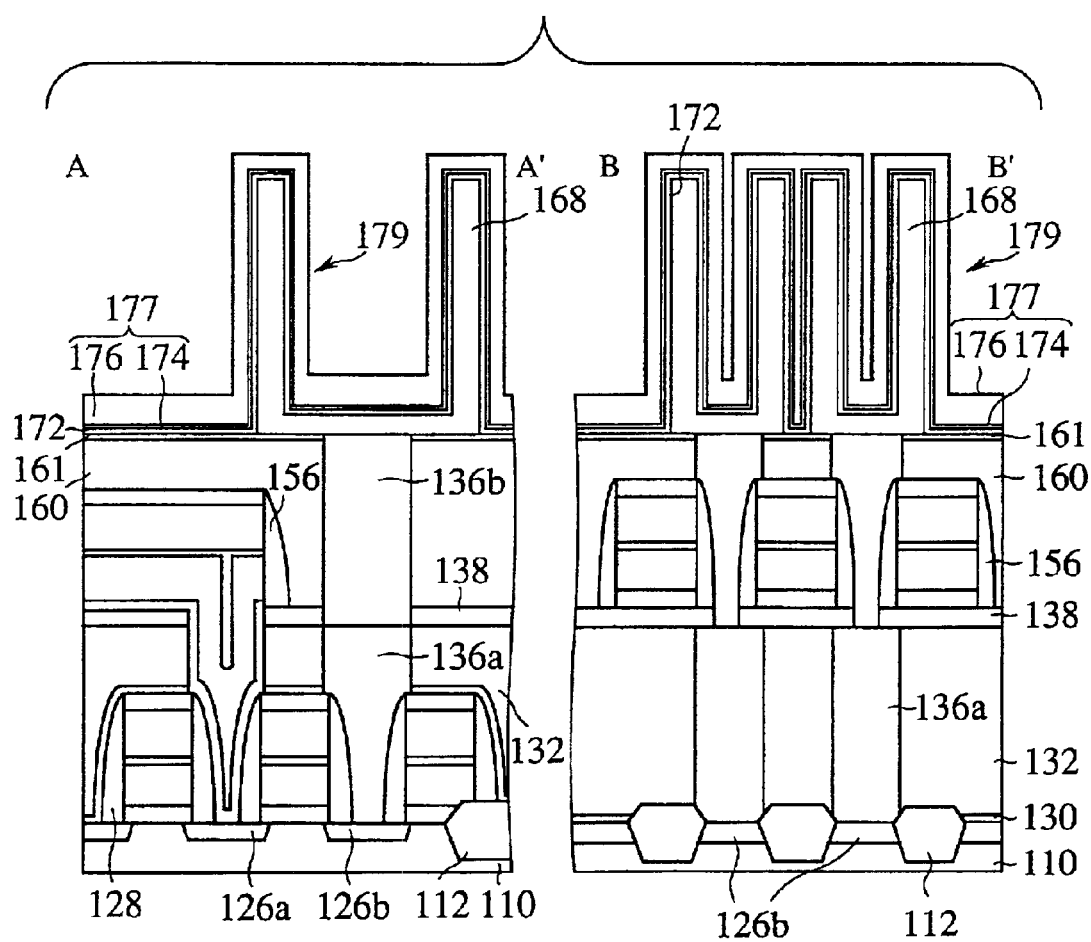
FIG. 17 is sectional views of the conventional semiconductor device in the steps of the process for fabricating the same, which explain the process (Part 3).

The semiconductor device according to a second embodiment of the present invention and the process for fabricating the semiconductor device will be explained with reference to FIGS. 11 to 14. FIG. 11 is sectional views of the semiconductor device according to the present embodiment. FIGS. 12A to 14 are sectional views of the semiconductor device in the steps of the process for fabricating the semiconductor device, which explain the process. The same members of the present embodiment as those of the semiconductor device and the process for fabricating the same according to the first embodiment are represented by the same reference numbers not to repeat or to simplify their explanation.

(Semiconductor Device)

First, the semiconductor device according to the present embodiment will be explained with reference to FIG. 11. The semiconductor device according to the present embodiment is characterized mainly in that the storage electrodes and the conductor plugs form the so-called dual damascene structure. As shown in FIG. 11, an etching stopper film 80a is formed on an inter-layer insulation film 60. Sidewalls 82a of polysilicon film are formed on the inside walls of openings 81a in the etching stopper film 80a. The sidewalls 82a are formed, partially below the etching stopper film 80a.

The storage electrodes 68b are formed integral with conductor plugs. The storage electrodes 68b arrive at the conductor plugs 36. Because the storage electrodes 68b are formed integral with the conductor plugs, the storage electrodes 68b can be securely fixed to the base, whereby the storage electrodes 68b are prevented from peeling off in HF-based wet etching.

The storage electrodes 68b is formed of polysilicon film. Because the storage electrodes 68b and the sidewalls 82a are formed of the same material, the storage electrodes 68b and the sidewalls 82a well adhere to each other. Furthermore, the sidewalls 82a are formed partially below the etching stopper film 80a, the storage electrodes 68b can be securely fixed to the base, so that the storage electrodes 68b are prevented from peeling off in HF-based wet etching.

(Process for Fabricating the Semiconductor Device)

Then, the process for fabricating the semiconductor device will be explained with reference to FIGS. 12A to 14.

The steps up to the step of forming the inter-layer insulation film 60 are the same as those of the process for fabricating the semiconductor device according to the first embodiment, and their explanation is omitted. Next, the etching stopper film 80a of 200 nm-thickness formed of silicon nitride film is formed on the entire surface. Silicon nitride film is used as a material of the etching stopper film 80a because silicon nitride film can have a high selectivity ratio to the inter-layer insulation film 60. The etching stopper film may be a conductor film but preferably an insulation film, because the conductor film must be removed in a later step.

Next, the etching stopper film 80a is patterned. At this time, the inter-layer insulation film 60 is etched preferably by a depth of about 100 nm from the surface of the inter-layer insulation film 60.

Next, the inter-layer insulation film 60 below the etching stopper film 80a is side-etched by HF-based wet etching, whereby the sidewalls 82a, which will be formed in a later step, are formed even below the etching stopper film 80a. The sidewalls 82a can be securely fixed to the etching stopper film 80a. An etching amount of the side-etching of the inter-layer insulation film 60 can be 2–20 nm, e.g., about 10 nm, in the horizontal direction as viewed in FIG. 12A.

Then, a 100 nm-thickness polysilicon film is formed on the entire surface by CVD. Next, the polysilicon film is anisotropically etched to form the sidewalls 82a on the inside walls of the openings 81a in the etching stopper film 80a. Because of the sidewalls 82a formed on the inside walls of the openings 81a in the etching stopper film, the openings 81a reduces a diameter by a thickness of the sidewalls 82a. The openings 81a have, e.g., a 80 nm×80 nm diameter. A thickness of the polysilicon film is suitably set so that a prescribed-diameter openings 84a can be formed by forming the sidewalls 82a of a prescribed thickness. The sidewalls 82a may be formed of a material other than polysilicon film as long as the material can be etched at a high selectivity ratio to the inter-layer insulation film 60. For example, silicon nitride film or others can be used. Thus, a mask 86a of the etching stopper film 80a and the sidewall insulation film 82a is formed (see FIG. 12A).

Then, an insulation film 64 is formed of a 0.8–1.2 $\mu$m-thickness, e.g., 1 $\mu$m-thickness BPSG film on the entire surface by CVD. Next, a 100 nm-thickness polysilicon film 88 is formed on the entire surface by CVD. Then, a reflection preventing film 90 of a 30 nm-thickness silicon nitride oxide film on the entire surface by CVD (see FIG. 12B).

Next, the reflection preventing film 90 and the polysilicon film 88 are patterned to remove the reflection preventing film 90. Then, with the polysilicon film 88 as a mask, the insulation film 64, the inter-layer insulation film 60, the protection film 59 and the silicon oxide film 38 are etched at a high selectivity ratio to the mask 86a, whereby openings 66 for forming the storage electrodes of the capacitor, and contact holes 35a arriving at the conductor plugs 36 are formed (see FIG. 13A).

Subsequently, a 50 nm-thickness polysilicon film is formed on the entire surface. Then, a 1.3 $\mu$m-thickness resist film is formed on the entire surface. The polysilicon film and the resist film are polished by CMP until the surface of the insulation film 64 is exposed. Next, the resist film on the inside walls of the storage electrodes 68 is removed by ashing. Thus, the storage electrodes 68b integrated with the conductor plugs which arrive at the conductor plugs 36 are formed.

Then, the insulation film 64 is etched by HF-based wet etching. In the process for fabricating the semiconductor device according to the present embodiment, the storage electrodes 68a formed integral with the conductor plugs are formed, whereby the storage electrodes 68b can be securely fixed to the base. In addition, the sidewalls 82a of the same material as the storage electrodes 68b are formed even below the etching stopper film 80a, whereby the storage electrodes 68b are further securely fixed. The storage electrodes 68b can be further prevented from peeling.

As described above, according to the present embodiment, the storage electrodes and the conductor plugs are formed integral with each other, whereby the storage electrodes can be securely fixed to the base. The storage electrodes 68b can be prevented from peeling in the HF-based wet etching.

According to the present embodiment, the sidewalls formed partially below the etching stopper film are formed of the same material as the storage electrodes, whereby the storage electrodes can be further securely fixed to the base.

According to the present embodiment, the contact holes for the conductor plugs to be buried in, and the openings for forming the storage electrodes are formed in one and the same step, whereby the process for fabricating the semiconductor device can be simple.

According to the present embodiment, the etching stopper film is used as the insulation film, whereby it is not necessary to remove the insulation film. This simplify the steps.

[Modifications]

The present invention is not limited to the above-described embodiments and can cover other various modifications.

For example, although the etching stopper film 80 is provided by polysilicon film in the first embodiment, the etching stopper film 80 may be provided by an insulation film. The etching stopper film 80 is provided by an insulation film, whereby it is not necessary to remove the etching stopper film 80. This simplifies the steps.

Although the conductor plugs 36 and the conductor plugs 37 are formed separate form each other in the first embodiment, the conductor plugs 36 and the conductor plugs 37 may be formed integral with each other. That is, when the conductor plugs 37 are formed, contact holes arriving at the source/drain diffused layer 27 may be formed, and the conductor plugs arriving at the source/drain diffused layer 27 may be formed in the contact holes.

Although the storage electrodes 68*b* and the conductor plugs 36 are formed separate form each other in the second embodiment, the storage electrodes 68*b* and the conductor plugs 36 may be formed integral with each other. That is, when the storage electrodes 68*b* are formed, contact holes arriving at the source/drain diffused layer 27 are formed, and the storage electrodes 68*b* reaching the source/drain diffused layer 27 may be formed in the contact holes.

Although the contact holes 40 arriving at the source/drain diffused layer 26 of the transfer transistors, and the contact holes 41 reaching the source/drain diffused layer 29 of the peripheral transistors are formed in one and the same step in the first embodiment, the contact holes 41 may not be essentially formed in the same step as the contact holes 40 are formed, and may be formed in one and the same step as the contact holes 33 are formed.

Although the rough-surfaced polysilicon film is formed on the surfaces of the storage electrodes 68 after the insulation film 64 has been etched in the first embodiment, the rough-surfaced polysilicon film may be formed on the inside walls of the storage electrodes 68 before the insulation film 64 is etched.

In the first embodiment, the rough-surfaced polysilicon film is formed on the surfaces of the storage electrodes 68 after the insulation film has been etched, but the storage electrodes 68 may be formed of the rough-surfaced polysilicon film. That is, the rough-surfaced polysilicon film is formed on the entire surface after the openings 66 have been formed in the insulation film 64, and the storage electrodes may be formed of the rough-surfaced polysilicon film.

In the second embodiment, the sidewalls 82*a* are formed of the same material as the storage electrodes 68*b* in the second embodiment, but the sidewalls 82*a* may be formed of a material different from that of the storage electrodes 68*b* as along as the material of the sidewalls 82*a* can securely fix the storage electrodes 68*b* to the base.

In the first and the second embodiments, the capacitors are cylindrical, but a shape of the capacitors is not essentially limited to the cylindrical shape. The present invention is applicable to capacitors of any shape. For example, the present invention is applicable to pillar-shaped capacitors. In a case that a pillar-shaped capacitors are formed, a 200 nm-thickness polysilicon film is formed on the entire surface by CVD after the openings 66 shown in FIG. 8B or FIG. 13A have been formed, and then the polysilicon film is polished by CMP until the surface of the insulation film 64 is exposed, whereby the pillar-shaped storage electrodes of the polysilicon film can be formed.

In the second embodiment, the sidewalls 82*a* are formed, but the sidewalls 82*a* are not essential as long as the storage electrodes are formed integral with the conductor plugs, whereby the storage electrodes can be securely fixed to the base.

In the first and the second embodiments, the bit lines have a 120 nm-width, but a width of the bit lines may not be essentially 120 nm and can be suitably set. The present invention is technologically able to form suitably micronized bit lines of below 200 nm. A width may be suitably set to be, e.g., 50–160 nm.

In the first and the second embodiments, a diameter of the contact holes is 80 nm×80 nm, but a diameter of the contact holes is not limited to 80 nm×80 nm. A diameter of the contact holes can be suitably set. The present invention is technologically able to form suitably micronized contact holes of below 200 nm×200 nm diameters. A diameter of the contact holes may be suitably set to be, e.g., 50 nm×50 nm–160 nm×160 nm.

In the first and the second embodiment, the storage electrodes are formed of rough-surface polysilicon film, but the storage electrodes may not be essentially formed of rough-surfaced polysilicon film. The storage electrodes may not be formed of rough-surfaced polysilicon film as long as the capacitances are formed in a cylindrical shape or others, whereby a required capacitance can be ensured. The storage electrodes may be formed of, e.g., the usual polysilicon film or others.

In the second embodiment, the sidewalls 82*a* are formed partially below the etching stopper film 80*a*. However, the sidewalls 82*a* may not be formed partially below the etching stopper film 80*a* as long as the storage electrodes 68*b* can be securely fixed to the base.

In the first and the second embodiments, the protection film for covering the bit lines is formed. However, the protection film is not essentially necessary as long as a voltage resistance between the bit lines and the conductor plugs or a voltage resistance between the bit lines and the storage electrodes can be sufficiently ensured.

In the first embodiment, the mask 86 is removed by CMP. However, in a case that the mask 68 is formed of an insulation film, the mask 86 may not be removed.

What is claimed is:

1. A process for fabricating a semiconductor device comprising the steps of:

forming a first insulation film above a base substrate;

forming on the first insulation film a second insulation film having different etching characteristics from the first insulation film;

forming on the second insulation film a third insulation film having different etching characteristics from the second insulation film;

etching the third insulation film and the second insulation film to form a first opening which arrives at the first insulation film;

etching the first insulation film and the third insulation film to expose a bottom of the second insulation film and a top of the second insulation film;

forming a storage electrode on an inside wall of the first opening, the storage electrode being electrically connected to the base substrate, the storage electrode having a lower end portion intruded below the second insulation film; and etching the third insulation film with the second insulation film as an etching stopper.

2. A process for fabricating a semiconductor device according to claim 1, wherein
in the step of forming the first insulation film, a conductor plug is formed, buried in the first insulation film, and
in the step of forming the storage electrode, the storage electrode is formed, electrically connected to the base substrate through the conductor plug.

3. A process for fabricating a semiconductor device according to claim 1,
further comprising, after the step of forming the first insulation film and before the step of forming the second insulation film, the steps of:
forming on the first insulation film a fourth insulation film having different etching characteristics from the first insulation film;
etching the fourth insulation film to form a second opening which arrives at the first insulation film;
forming on the inside wall of the second opening a sidewall film having different etching characteristics from the first insulation film;
etching the first insulation film with the fourth insulation film and the sidewall film as a mask to form a contact hole in the first insulation film; and
forming a conductor plug in the contact hole.

4. A process for fabricating a semiconductor device according to clam 1,
further comprising, before the step of forming the first insulation film, the steps of:
forming a first conductor film above the base substrate;
forming on the first conductor film a photo-mask having a wiring pattern of a first width;
etching the photo-mask to reducing the first width of the photo-mask to a second width which is smaller than the first width, and
etching the first conductor film by using the photo-mask to form a bit line of the second width formed of the first conductor film above the base substrate.

5. A process for fabricating a semiconductor device according to claim 3,
further comprising, before the step of forming the first insulation film, the steps of:
forming a first conductor film above the base substrate;
forming on the first conductor film a photo-mask having a wiring pattern of a first width;
etching the photo-mask to reducing the first width of the photo-mask to a second width which is smaller than the first width, and
etching the first conductor film by using the photo-mask to form a bit line of the second width formed of the first conductor film above the base substrate.

6. A process for fabricating a semiconductor device according to claim 4,
further comprising, after the step for forming the bit line and before the step of forming the first insulation film,
a step of forming at least on side surfaces of the bit line a fourth insulation film having different etching characteristics from the first insulation film.

7. A process for fabricating a semiconductor device according to claim 5,
further comprising, after the step for forming the bit line and before the step of forming the first insulation film,
a step of forming at least on side surfaces of the bit line a fifth insulation film having different etching characteristics from the first insulation film.

8. A process for fabricating a semiconductor device according to claim 6, wherein
in the step of forming the fourth insulation film, the fourth insulation film is formed also on an upper surface of the bit line.

9. A process for fabricating a semiconductor device according to claim 7, wherein
in the step of forming the fifth insulation film, the fifth insulation film is formed also on an upper surface of the bit line.

10. A process for fabricating a semiconductor device according to claim 1,
further comprising, before the step of forming the first insulation film the steps of:
forming a first wiring layer and a second wiring layer through a fourth insulation film above a semiconductor substrate;
forming a fifth insulation film on an upper surface and side surfaces of the first wiring film, and an upper surface and side surfaces of the second wiring layer;
forming above the semiconductor substrate and the fifth insulation film a sixth insulation film having different etching characteristics from the fifth insulation film;
forming in the fifth insulation film and the sixth insulation film a first contact hole arriving at the first wiring layer; and
forming in the sixth insulation film a second contact hole arriving at the semiconductor substrate by self-alignment with the fifth insulation film covering the second wiring layer.

11. A process for fabricating a semiconductor device according to claim 3,
further comprising, before the step of forming the first insulation film, the steps of:
forming a first wiring layer and a second wiring layer through a fifth insulation film above a semiconductor substrate;
forming a sixth insulation film on an upper surface and side surfaces of the first wiring film, and an upper surface and side surfaces of the second wiring layer;
forming above the semiconductor substrate and the sixth insulation film a seventh insulation film having different etching characteristics from the sixth insulation film;
forming in the sixth insulation film and the seventh insulation film a first contact hole arriving at the first wiring layer; and
forming in the seventh insulation film an second contact hole arriving at the semiconductor substrate by self-alignment with the sixth insulation film covering the second wiring layer.

12. A process for fabricating a semiconductor device according to claim 10, further comprising, the steps of:
after the step of forming the second contact hole, forming a first conductor film in the first contact hole and the second contact hole and on the sixth insulation film; and
after the step of forming the first conductor film, performing a heat treatment at a temperature of above 900° C.

13. A process for fabricating a semiconductor device according to claim 11, further comprising, the steps of:
after the step of forming the second contact hole, forming a first conductor film in the first contact hole and the second contact hole on the seventh insulation film; and
after the step of forming the first conductor film, performing a heat treatment at a temperature of above 900° C.

* * * * *